United States Patent
Bonderover et al.

(10) Patent No.: US 11,664,817 B2
(45) Date of Patent: May 30, 2023

(54) METHOD AND SYSTEM FOR TELEMETRY ENHANCEMENT

(71) Applicant: MS Directional, LLC, Conroe, TX (US)

(72) Inventors: Eitan Bonderover, Sugar Land, TX (US); Shyam Mehta, Missouri City, TX (US); Libo Yang, Houston, TX (US)

(73) Assignee: MS Directional, LLC, Conroe, TX (US)

( * ) Notice: Subject to any disclaimer, the term of this patent is extended or adjusted under 35 U.S.C. 154(b) by 0 days.

(21) Appl. No.: 17/477,704

(22) Filed: Sep. 17, 2021

(65) Prior Publication Data

US 2023/0087069 A1   Mar. 23, 2023

(51) Int. Cl.
*H03M 7/30* (2006.01)
*H04L 27/26* (2006.01)

(52) U.S. Cl.
CPC ...... *H03M 7/3062* (2013.01); *H04L 27/2662* (2013.01)

(58) Field of Classification Search
CPC .......................... H04L 27/2662; H03M 7/3062
USPC .................................................. 375/340, 240
See application file for complete search history.

(56) References Cited

U.S. PATENT DOCUMENTS

| | | | |
|---|---|---|---|
| 2008/0219244 A1* | 9/2008 | Malhotra | H04L 69/24 370/352 |
| 2011/0002223 A1* | 1/2011 | Gross | H04L 41/0896 370/235 |
| 2011/0025525 A1* | 2/2011 | Akimov | E21B 47/12 340/853.2 |
| 2017/0211378 A1* | 7/2017 | Derkacz | E21B 47/13 |

\* cited by examiner

*Primary Examiner* — Kevin M Burd
(74) *Attorney, Agent, or Firm* — Jackson Walker, LLP

(57) ABSTRACT

The disclosure provides a method and system to recover some or all of the data missing in types of gaps that occur in data streams received via telemetry. The gaps can be filled in real time to enhance operator understanding of current operations. For gaps created by special sequences sent via telemetry during a time interval that telemetry would be sending measurement blocks (MB) of data, the gaps can be filled using special MBs combined with MBs for a next time interval to create combined MBs, sent via telemetry, and extracted to backfill the gaps. For gaps caused by corrupted data, the gaps can be filled with data from overlapping MBs having overlapping data based on overlapping time intervals. For gaps caused by gap events, including different drilling rates of penetration, event MBs with sampling rates different than a predetermined sampling rate can be sent via telemetry.

30 Claims, 16 Drawing Sheets

METHOD AND SYSTEM FOR TELEMETRY ENHANCEMENT

STATEMENT REGARDING FEDERALLY SPONSORED RESEARCH OR DEVELOPMENT

Not applicable.

CROSS REFERENCE TO RELATED APPLICATIONS

Not applicable.

REFERENCE TO APPENDIX

Not applicable.

BACKGROUND OF THE INVENTION

Field of the Invention

The disclosure generally relates to telemetry and processing telemetry signals. Specifically, the disclosure relates to telemetry and enhancements of signals that have defects, such as for oilfield downhole telemetry to surface.

Description of the Related Art

Telemetry has been defined as the science and technology of automatic measurement and transmission of data by wire, radio, or other means from remote sources to receiving stations for recording and analysis. Telemetry is practiced in many environments from below the earth in oilfield transmissions from downhole instruments to environments above the earth from space vehicles. The telemetry is typically transmitted from a sending unit to a receiving station for data processing and output that is needed for operational guidance or input. A key issue is the integrity of the transmitted data particularly in environments that are constrained in the data rates from the methodology of transmission available for the application.

FIG. 1 is a schematic example of a system using telemetry to communicate data from a downhole tool in a well bore to a receiving station at the surface. An oil rig 34 generally is used to drill a hydrocarbon well 35 to establish a wellbore 36. A drill string 37 of pipe and tooling is progressively inserted into the wellbore as drill bits progressively deepen the wellbore. A mud pump 38 pumps mud through an inlet conduit 39 to the drill string 37 to travel downward through the drill string and through a downhole telemetry tool 40 with a modulator and a Bottom Hole Assembly (BHA) 41 with a drill bit to help flush cuttings from the drill bit. The mud pressure causes the mud and cuttings to return up an annulus between the larger wellbore and the small drill string to the surface and into a return conduit 42. The mud flows over a screen to separate larger particles and returns to the mud pit 43. In oil field operations for Measurements While Drilling (MWD) services, various measurements data acquired downhole is sent from the downhole telemetry tool 40 that aggregates data and sends using various telemetry methodology like mud-pulse, electromagnetic, acoustic, wired drill pipe and others. A related process is Logging While Drilling (LWD). The MWD and/or LWD can be generally referred to herein as MLWD and the downhole telemetry tool 40 is typically an MLWD tool in an MLWD system that can transmit measurement data via telemetry to an uphole receiving station 102 generally with a processor for extracting the telemetry data. Current MLWD methodology using mud telemetry depends on the mud flowing in the downhole pipes and actively circulating in a drilling column circuit between downhole and surface locations. The telemetry is typically sent in sequences. The order of the data sent uphole in any of the sequences is predetermined based on the sequence identifier word preceding the sequence data.

FIG. 2 is a list of exemplary measurements that can be included in measurement sequences for MLWD. FIG. 3 is a schematic diagram of an exemplary set of measurement blocks that can be communicated via telemetry. Due to the nature of the telemetry medium and the harsh environment in the oil field applications, the physical data rates have typically been extremely slow from 0.25 bits-per-second (bps) to 6 bps in the MLWD industry. Hence, it is well known in the industry to configure the data in blocks downhole and send the blocks in telemetry. The data blocks are referred to herein as Measurement Blocks (MB) having the data. In many applications, the data is compressed for the data blocks to be sent to the uphole receiving station to be decompressed and analyzed to recreate a data stream 8 of measurement samples acquired by the MLWD and compressed for the transmission (sometimes referred to herein as "measurement data stream" or "data stream"). The data stream can be recreated from MBs of a particular type of measurement at different time intervals. Alternatively, the data stream can be recreated from MBs containing a variety of types of measurements and the different types sorted at some time for further analysis. There are various ways for compression and some examples are explained in U.S. Pat. Nos. 7,805,247, 8,305,243, and 9,866,835. As examples, the compression can be lossy compression or lossless compression.

There are other ways to configure a measurement block than with compressed data. For example, when similar measurements are highly related to each other and vary very little from each other, then a data block can be made of differential values for a majority of measurements relative to a primary measurement. Other data types are single sample and not block data, and can be sent via telemetry without compression.

When starting up (or restarting after a temporary operational break) well drilling operations or other oil field practices in most cases, the first few pressure pulses generated is a predetermined telemetry synchronization, followed by a static Directional and Azimuth Survey (known as a D&I Survey or Stationary Survey) sequence (SS) 2. The SS sequence 2 is typically used to access starting conditions and location prior to commencing operations such as drilling with the typical categories of data shown in FIG. 1. After the SS sequence is sent, a Tool Face (TF) or Rotating (ROT) sequence (not shown) is sent conditioned on whether the downhole BHA is sliding or rotating. A TF sequence of typical measurements while operating (such as drilling) is shown in FIG. 1. For purposes herein, a Repeating Sequence (RP) 4 can be used interchangeably to refer to either a TF Sequence or ROT Sequence as item 4, unless the context indicates otherwise. The RP Sequence of either type (or others) can continue for the given condition, unless interrupted until the mud circulation is stopped as shown in FIG. 3 with the SS sequence 2 followed by multiple TF sequences 4A-4D with associated MBs 10A-10D for the TF sequences. MB data can vary, some of which can exist in the SS sequence and some in the TF sequence. The MB data as shown contains the result of a series of samples of a measurement which are compressed. Once the receiving station computer (typical uphole on surface) decodes the MB data, the computer can extract the series of samples from the MB data generally in the same order as the data was sent and then received to produce measurement data stream 8. Thus, the compression of the MB data can increase the effective telemetry data rate of the MLWD system. There can be multiple MB data in a TF sequence or other RP sequence. For convenience of understanding the concept, there is only one MB per TF sequence shown in the Figures and described herein.

However, gaps in the measurement samples through the telemetry can occur with no valid data for a given time period. For example, gaps can occur due to initial starts and restarts from temporary operational stops. Gaps can occur when the MLWD tools transmits via telemetry a high priority sequence of special data in-between two RP sequences. Gaps can also occur by interference in the communication channel due to noise in the telemetry signal. The noise would cause corrupted data to be received and is discarded. Gaps can occur from a sampling spacing that is sent via telemetry that is insufficient to capture important data during gap events, such as when a drill bit encounters a soft strata and the drilling speed increases to a speed that the reported data lacks sufficient details.

FIG. 4 is a schematic diagram of telemetry sequences illustrating a gap when operations begin before or while a Stationary Survey sequence is transmitted. A typical sequence set 6 includes an SS sequence 2 following by a plurality of RP sequences 4A-4D with associated MBs 10A-10D, illustrated and described as TF sequences for the example. A gap 12 in the measurement samples is shown as described below.

Regarding gaps due to start and restarts, when the mud pumps are started and have sufficient flow the MLWD tool will turn on the modulator and start sending the telemetry synchronization sequence followed by the SS sequence 2 to the receiving station 102 (shown in FIG. 1). This SS sequence 2 takes several minutes to complete especially at low telemetry rates. Typically, there is no transmission during this time of other formation measurement data like Gamma Ray, Resistivity, and so forth, in TF sequences as shown in FIGS. 3 and 4. Hence, if the formation measurement data are critical, the operator has to wait to drill until the SS sequence 2 is fully transmitted and the formation data starts. This wait time reduces the drilling efficiency, which is measured in average Rate Of Penetration (ROP) for the well.

The SS sequence 2 data is needed each time an additional pipe joint is added to a drill string at greater depth. To add an additional pipe joint, the mud pumps are shut down. The shutdown causes the downhole MLWD tool to recognize that the new stand is being added and it is time to acquire the data for the SS sequence 2. After the new joint is added, the drill string is lowered back down to the bottom of the hole, pumps are turned on, and the modulator can start sending the SS sequence 2 over several minutes. In the same manner, this wait takes valuable time and decreases drilling efficiency.

Realistically, some operators elect to avoid waiting for the SS sequence to finish transmitting to the receiver station before starting drilling. When the SS sequence 2 finishes, the RP sequences 4 start sending needed formation and other drilling data. When drilling is resumed before and during the transmission of the SS sequence when normally the RP sequences would be sent, the much needed formation data for the drilled distance is not being sent until the SS sequence is finished, creating a gap 12 in potentially important measurement data stream 8.

FIG. 5 is a schematic diagram of telemetry sequences illustrating two types of gaps described herein. One type of gap illustrates the gap described in FIG. 4. Another type of gap occurs in measurement data stream 8 due to data being discarded because of noise interference. Regarding gaps in the measurement samples due to noisy telemetry, the data for a particular RP sequence may be corrupted due to the interference in the communication channel and represents a data gap. For example, the TF sequences 4A, 4B and 4D have acceptable MBs 10A, 10B, and 10D. However, the TF sequence 4C has an unacceptable MB 10C with corrupted data, marked by an "X". Due to the corruption, the uphole computer cannot recover correct measurement samples, creating a data gap 12C in the measurement data stream 8. Thus, the resulting measurement data stream 8 are missing potentially valuable information. Further, if the expected telemetry noise levels are too high, frequent gaps can result in the telemetry. In the usual process, compressing the data in an MB allows the MLWD tool to send high sampling rate data to the receiving station. Thus, a lack of a compressed data in an MB can result in lower sampling rates for all measurements, or the operator has to lower the drilling rate to obtain the preferred sampling rate for better resolution. Those in the field know that lower time-resolution results in a lower depth-resolution, and can cause missed thin beds containing hydrocarbons or poor definition of bed thickness. Lower drilling rates or Rate of Penetration (ROP) causes a longer time to reach the target depth or touch down, increasing the cost of the well.

Regarding gaps from gap events, such as a rate of change of a given parameter outside of an acceptable variance, a tool failure or other issue, or measurement outside a given range, or other anomalies. For example, a rate of change outside of an acceptable variance can occur with a sudden change in ROP if the drilling encounters a change in strata, or a sudden increase and decrease in formation measurement levels that may indicate a presence of a thin hydrocarbon layer. The sampling data being used to create the MB to send via telemetry may have insufficient information to provide important details occurring for the gap event and therefore creates a gap of information. Using ROP as a more detailed example, current technology can allow drilling speeds of several hundred feet per hour depending on strata conditions. While acquisition of data at a high resolution from a high sampling rate may occur downhole, the transmission of data via telemetry is normally reported at a lower resolution (effectively modelling a lower sampling rate) that has sufficient fidelity under normal conditions. However, during this high-speed drilling, the normal practice of sending the lower resolution data via telemetry can miss thin relevant geological hydrocarbon beds. For example, at a 0.5 bits per second (bps) telemetry transmission rate, and 400 feet per hour (ROP), and measurement sampling rate of 30 seconds per sample, it is more likely to miss a three feet or less size thin formation bed of hydrocarbons. In many cases, the available ROP is even greater, which can potentially miss even thicker formation hydrocarbon beds.

The industry has answered these short comings with the MB data transmission to some extent. The data transmission functions well when the telemetry is noise free but even in a moderately noisy environment, there is generally a number of gaps introduced in a measurement data stream due to corrupted data. The gaps are not desirable. However, the industry has become accustomed to such gaps and the lack of fidelity in the results. To accommodate such gaps, the industry relies upon experience to guess and estimate the missing results in the gaps.

There remains a need for a method and system to recover some or all of the data for the gaps, whether corrupted or omitted, to better supply useful data in a resulting output, particularly in real time.

BRIEF SUMMARY OF THE INVENTION

The disclosure provides a method and system to recover some or all of the data missing in types of gaps that occur in data streams received via telemetry. These gaps can be filled in real time to enhance operator understanding of current operations. For gaps created in a normal measurement data stream by special sequence sent via telemetry during time intervals that otherwise telemetry would be sending measurement blocks (MB) of data, the gaps can be filled with data from special MBs combined with MBs for next time intervals to create combined MBs to be sent via telemetry and the special MBs extracted to backfill the gaps. For gaps caused by corrupted data in a data stream, overlapping MBs having overlapping data based on overlapping time intervals can be used to extract the missing data and fill the gaps. For gaps caused by gap events, such as different drilling rates of penetration, event MBs with sampling rates that are different than a predetermined sampling rate can be sent via telemetry to fill the gap.

The disclosure provides a method of enhancement in telemetry communications between a downhole transmitting tool in a hydrocarbon wellbore and a receiving station, comprising: aggregating sets of data of downhole measurements into a plurality of measurement blocks for a time interval for each measurement block; transmitting in telemetry the measurement blocks from the downhole transmitting tool to be received by the receiving station; evaluating the sets of data for a gap of data; filling at least a portion of the gap of data with data of downhole measurements corresponding to the time interval of the gap of data: and creating a measurement data stream of data from the measurement blocks with at least the portion of the gap of data filled.

Aggregating sets of data of downhole measurements can include aggregating at least one set of data with a special set of data corresponding to at least a portion of a time interval that overlaps with a special sequence being sent in telemetry to the receiving station and a next set of data corresponding to a next time interval to the special set of data to create a combined measurement block; and further includes using the combined measurement block of data to at least partially fill the gap and supply the next set of data for the measurement data stream. In some embodiments, the method can include determining a cause of the gap of data, and if the cause is by a special sequence being sent by telemetry, then using the combined measurement block.

Aggregating sets of data of downhole measurements can include aggregating overlapping sets of data based on overlapping time intervals to create one or more adjacent overlapping measurement blocks; and further includes discarding the corrupted data for a corresponding time interval, and filling at least partially the gap with data from at least one of the adjacent measurement blocks corresponding to the time interval of the corrupted data. In some embodiments, the method can include determining a cause of the gap of data, and if the cause is by corrupted data in a set of data, then discarding the corrupted data and filling at least partially the gap.

Aggregating sets of data of downhole measurements can include aggregating at least one set of data in an event measurement block in a sequence set of a plurality of measurement blocks with a sampling rate that is different than a predetermined sampling rate of a set of data in another measurement block in the sequence set; and further includes filling at least partially the gap with data from the at least one set of data in the event measurement block with the sampling rate that is different than the predetermined sampling rate. In some embodiment, the method can include determining a cause of the gap of data, and if the cause is by a gap event, then filling at least partially the gap.

The disclosure provides a system for telemetry enhancement, the system having at least a downhole transmitting tool for sending measurement data in telemetry, a receiving station to receive the measurement data, a data processing system in communication with the receiving station, and a communication path for sending the measurement data between the transmitting tool and the receiving station, the system configured to: aggregate sets of data of downhole measurements into a plurality of measurement blocks for a time interval for each measurement block; transmit in telemetry the measurement blocks from the downhole transmitting tool to be received by the receiving station; evaluate the sets of data for a gap of data; fill at least a portion of the gap of data with data of downhole measurements corresponding to the time interval of the gap of data: and create a measurement data stream of data from the measurement blocks with at least the portion of the gap of data filled.

DETAILED DESCRIPTION

Figure 1:
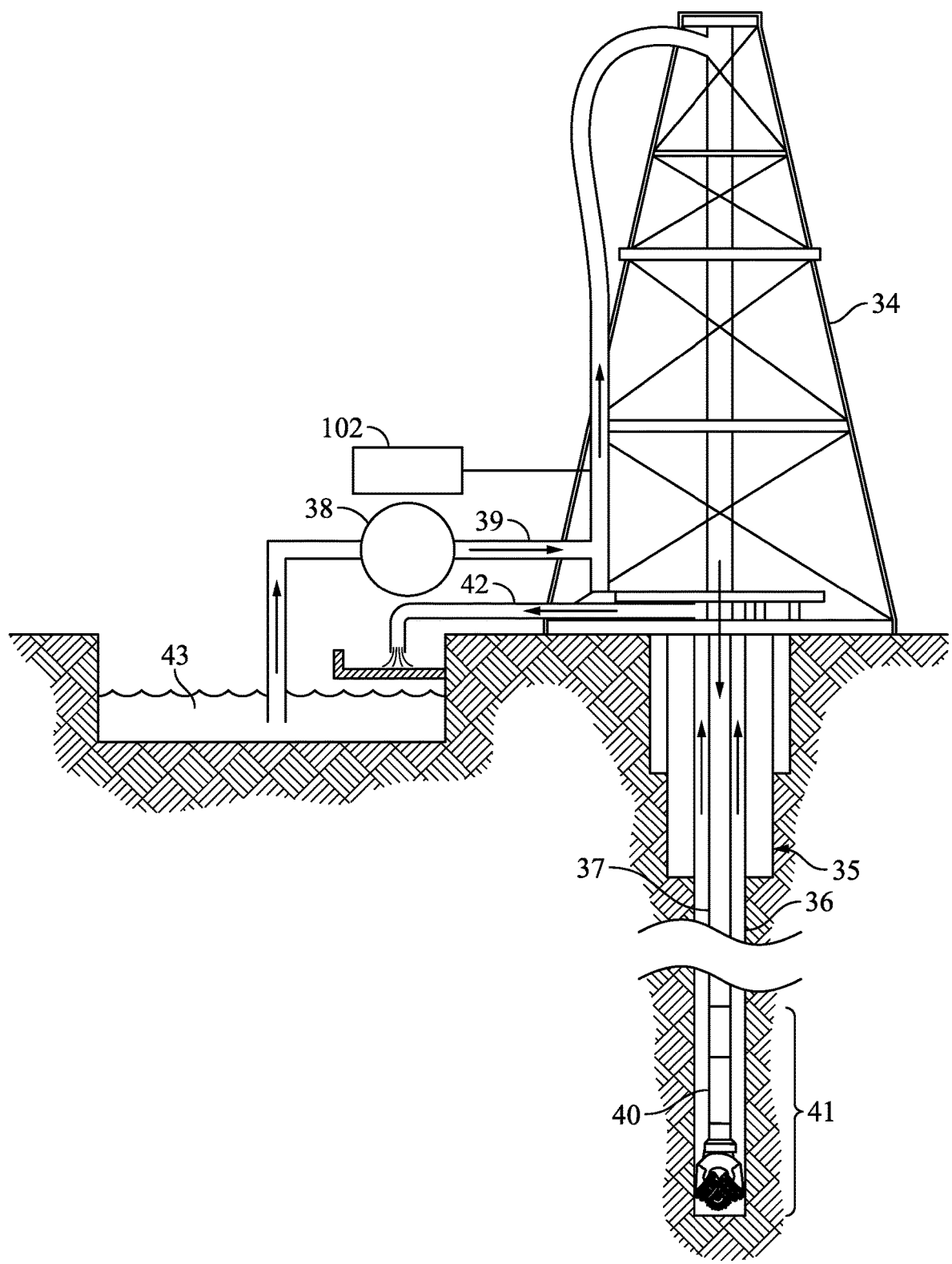
FIG. 1 is a schematic example of a system using telemetry to communicate data from a downhole tool in a well bore to a receiving station at the surface.

The Figures described above and the written description of specific structures and functions below are not presented to limit the scope of what Applicant has invented or the scope of the appended claims. Rather, the Figures and written description are provided to teach any person skilled in the art how to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present disclosure will require numerous implementation-specific decisions to achieve the developer's ultimate goal for the commercial embodiment. Such implementation-specific decisions may include, and likely are not limited to, compliance with system-related, business-related, government-related, and other constraints, which may vary by specific implementation, location, or with time. While a developer's efforts might be complex and time-consuming in an absolute sense, such efforts would be, nevertheless, a routine undertaking for those of ordinary skill in this art having benefit of this disclosure. It must be understood that the inventions disclosed and taught herein are susceptible to numerous and various modifications and alternative forms. The use of a singular term, such as, but not limited to, "a," is not intended as limiting of the number of items. Further, the various methods and embodiments of the system can be included in combination with each other to produce variations of the disclosed methods and embodiments. Discussion of singular elements can include plural elements and vice-versa. References to at least one item may include one or more items. Also, various aspects of the embodiments could be used in conjunction with each other to accomplish the understood goals of the disclosure. Unless the context requires otherwise, the term "comprise" or variations such as "comprises" or "comprising," should be understood to imply the inclusion of at least the stated element or step or group of elements or steps or equivalents thereof, and not the exclusion of a greater numerical quantity or any other element or step or group of elements or steps or equivalents thereof. The device or system may be used in a number of directions and orientations. The terms "top", "up", "uphole", "bottom", "down", "downhole", and like directional terms are used to indicate the direction relative to the figures and their illustrated orientation and are not absolute relative to a fixed datum such as the earth in commercial use. The term "coupled," "coupling," "coupler," and like terms are used broadly herein and may include any method or device for securing, binding, bonding, fastening, attaching, joining, inserting therein, forming thereon or therein, communicating, or otherwise associating, for example, mechanically, magnetically, electrically, chemically, operably, directly or indirectly with intermediate elements, one or more pieces of members together and may further include without limitation integrally forming one functional member with another in a unitary fashion. The coupling may occur in any direction, including rotationally. The order of steps can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions. Some elements are nominated by a device name for simplicity and would be understood to include a system of related components that are known to those with ordinary skill in the art and may not be specifically described. Various examples are provided in the description and figures that perform various functions and are non-limiting in shape, size, description, but serve as illustrative structures that can be varied as would be known to one with ordinary skill in the art given the teachings contained herein. As such, the use of the term "exemplary" is the adjective form of the noun "example" and likewise refers to an illustrative structure, and not necessarily a preferred embodiment. Element numbers with suffix letters, such as "A", "B", and so forth, or numbers with prime, double prime, and so forth, such as 1, 1', 1", and so forth, are to designate different elements within a group of like elements having a similar structure or function, and corresponding element numbers without the letters are to generally refer to one or more of the like elements. Any element numbers in the claims that correspond to elements disclosed in the application are illustrative and not exclusive, as several embodiments are disclosed that use various element numbers for like elements.

The disclosure provides a method and system to recover some or all of the data missing in types of gaps that occur in data streams received via telemetry. The gaps can be filled to enhance operator understanding of current operations and make appropriate adjustment to the operations to avoid waste and inefficiency. For gaps created by special sequences sent via telemetry during a time interval that telemetry would be sending measurement blocks (MB) of data, the gaps can be filled using special MBs combined with MBs for a next time interval to create combined MBs, sent via telemetry, and extracted to backfill the gaps. For gaps caused by corrupted data in a data stream, the gaps can be filled with data from overlapping MBs having overlapping data based on overlapping time intervals. For gaps caused by gap events, including different drilling rates of penetration, event measurement blocks with sampling rates different than a predetermined sampling rate can be sent via telemetry. The gaps can be filled in real time, meaning the time required to send data from the MWLD tool via telemetry to the receiving station, process the data, including filling gaps, so that results can be provided to an operator or other relevant personnel of downhole conditions to make commercially timely decisions during operations. In most cases, the delivery of the results varies from a fraction of a second to 15 minutes.

An explanation herein is given as an example using mud pulse telemetry for ease of understanding but as far as the subject matter of the invention is concerned, the same or similar telemetry methodology is applicable for the many other types of telemetry, such as electromagnetic, acoustic or mud-pulse wave, and so forth in multiple fields. In the illustrations herein, each technique is shown in the relevant figure to explain how the invention can be executed for the stated gap or other issue. However, it is to be understood that a plurality including all of the techniques can be deployed at the same time to make the drilling process more efficient in filling gaps to enhance a final data stream.

Figure 6A:
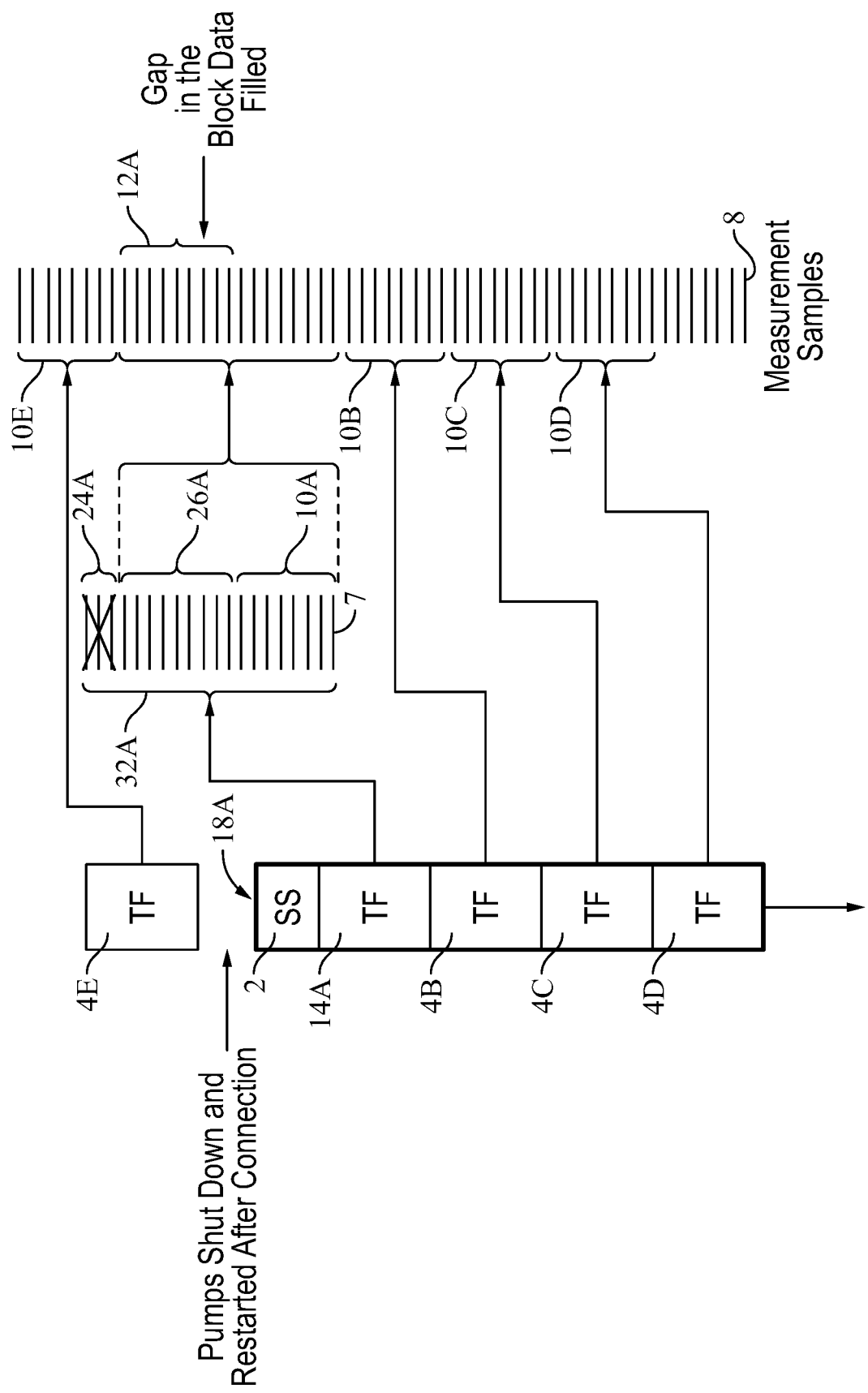
FIG. 6A is a schematic diagram of an embodiment of the present invention that can fill in a gap from missing data.

FIG. 6A is a schematic diagram of an embodiment of the present invention that can fill in a gap from missing data. FIG. 6A illustrates a solution to filling a data gap that can be created by a special sequence being sent in telemetry, such as the SS sequence 2 data being sent when an operator prematurely starts operations, such as drilling without waiting for the SS sequence to finish. A sequence set 18A differs from the typical sequence set 6 described in FIGS. 2-4 with a special TF sequence 14A producing a special set of data, here, a combined measurement block ("combined MB" or "CMB") 32A. In this embodiment, the combined MB 32A can include at least a second portion, designated in this embodiment as a Special Measurement Block (SMB) 26A, and a normal MB 10A. (The combined MB 32A can include a first portion as an overlapping portion 24A, as explained below.) The SMB 26A contains measurement data corresponding to at least a time interval that the SS sequence 2 was being sent while operations were occurring, that is, when at least a portion of a normal MB, such as shown in FIG. 3, would have been otherwise sent via telemetry if the SS sequence had been completed before operations were started. The combined MB 32A is illustrated diagrammatically in a separate column of intermediate measurement samples 7 to show further analysis and processing to populate the resulting measurement data stream 8 in the right hand column of FIG. 6A. This combined MB 32A from the TF sequence 14A can be predetermined and configured in the downhole MLWD tool in conjunction with uphole software at a receiving station. A special identifier can be sent with the combined MB 32A to alert the receiving station of the additional data and purpose. The SMB 26A data can be identified based on the occurrence of the SS sequence or another indicia of a progression of data sampling such as a Sequence ID, so that the data processing can determine the existence of a gap 12A of the measurement data stream 8 to extract the appropriate samples from the SMB. In this embodiment, the TF sequence 14A can have a same sampling frequency as a normal MB, such as MB 10B, but with a higher number of samples, resulting in the longer combined MB 32A with the SMB 26A. The first portion 24A, with additional data, which can overlap an earlier MB based on time before the pumps were shut off, can be discarded. The SMB 26A can be extracted by the receiving station and used to fill a gap 12A caused by the special sequence being sent in telemetry. As an alternative, the system could be configured to normally create a combined MB whenever an SS is scheduled to be sent, then the receiving station can check if any MB data is missing. If no MB data is missing, that is, the SS sequence was completed before operations began, then the SMB 26A can be discarded.

Figure 6B:
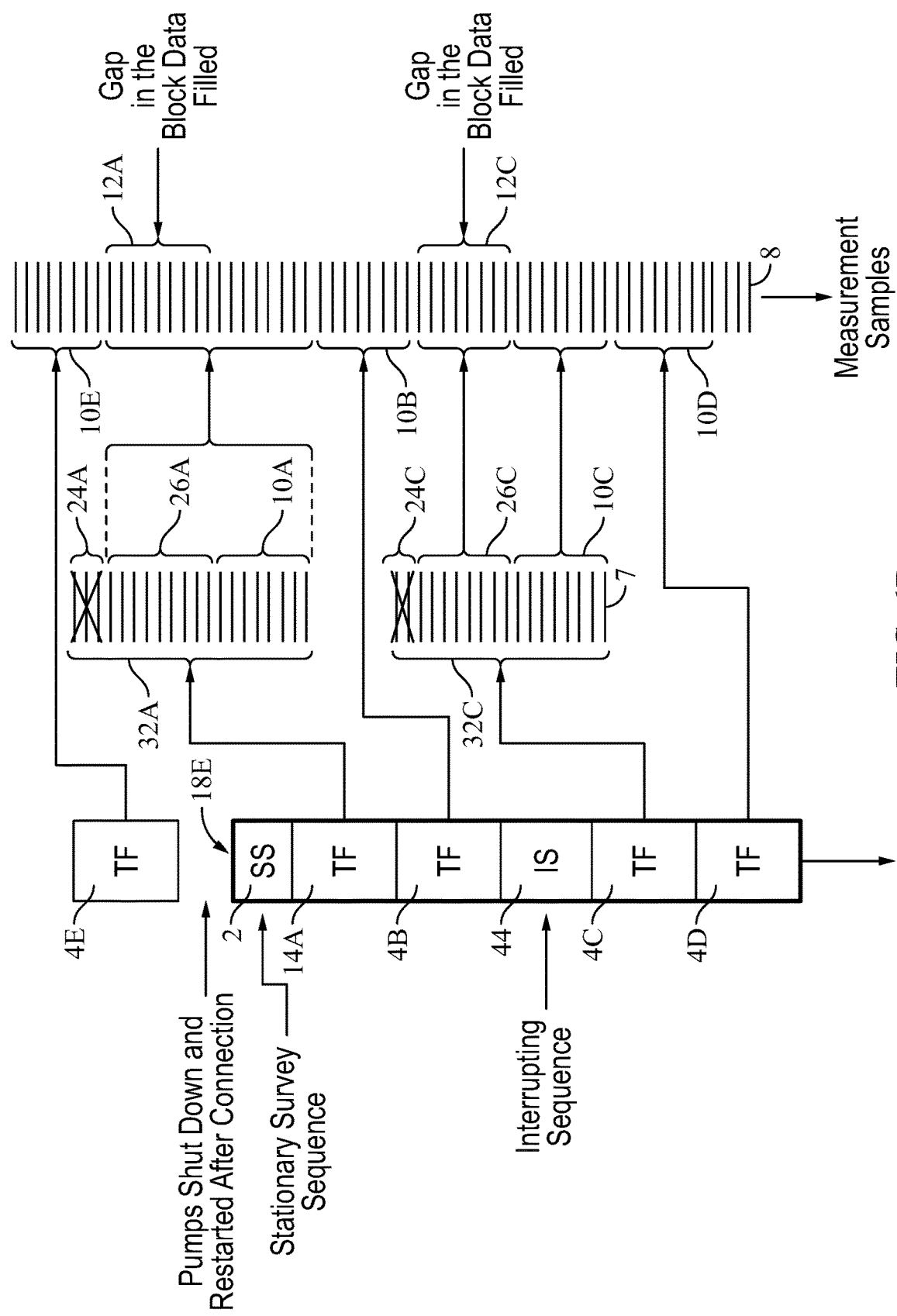
FIG. 6B is a schematic diagram of another embodiment of the present invention that can fill in a gap from missing data.

FIG. 6B is a schematic diagram of another embodiment of the present invention that can fill in a gap from missing data created by a special sequence being sent in telemetry. FIG. 6B continues to show the special sequence embodiment of the SS described in FIG. 6A, but also shows another special sequence 44, termed an interrupting sequence. A gap of data 12C caused by the interrupting sequence 44, and solution for filling the gap is similar to the solution described in FIG. 6A. Also, an occurrence of an interrupting sequence is independent of an occurrence of an SS sequence and need not occur in the same sequence set 18.

More specifically, there are instances where a telemetry bandwidth is temporarily used to send high priority data. As an example, interruptions can be caused when another tool, such as tool in a BHA that may be in proximity to the MLWD tool, has high priority data to be sent via telemetry to the receiving station. The high priority data could be due to an abnormal event, such as a detected sudden change in formation or a detected performance issue with a tool. The high priority data can use the interrupting sequence, inserted between RP sequences being sent, such as between TF sequences 4B and 14C. The interrupting sequence 44 can provide instructions to acquire the high priority data, or such data can be known, and the interrupting sequence can provide instructions for the data to be sent and extracted by the receiving station. With the interrupting sequence 44, regular data in MB may not be sent for a time interval while the interrupting sequence data is sent via telemetry, thus conflicting with the time interval that the MB would otherwise use. The methods described above regarding FIG. 6A for filling in the gap caused by a delay from an SS sequence being sent can be used in a similar fashion for filling in a gap caused by an interrupting sequence being sent. Similarly, a CMB having an SMB for data at least during the interrupting sequence combined with an MB of data of a next time interval can be sent via telemetry and the SMB extracted from the CMB data to fill the gap.

Figure 2:
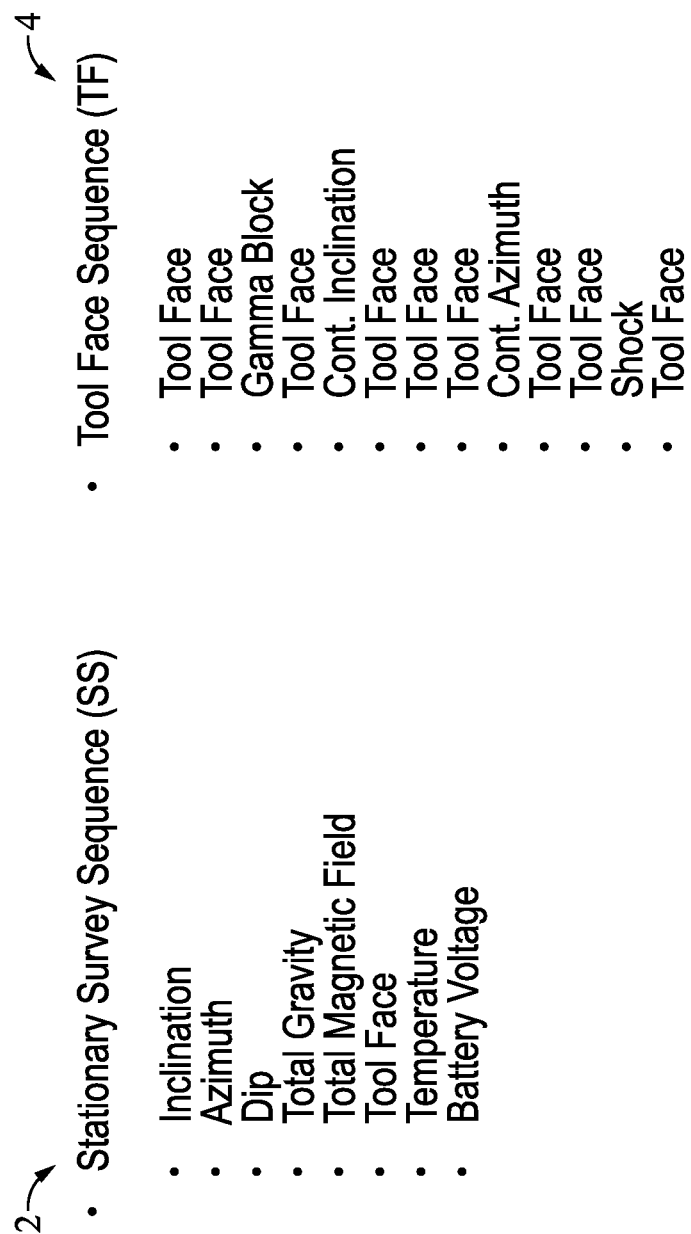
FIG. 2 is a list of exemplary measurements that can be included in measurement sequences for MLWD.
Figure 3:
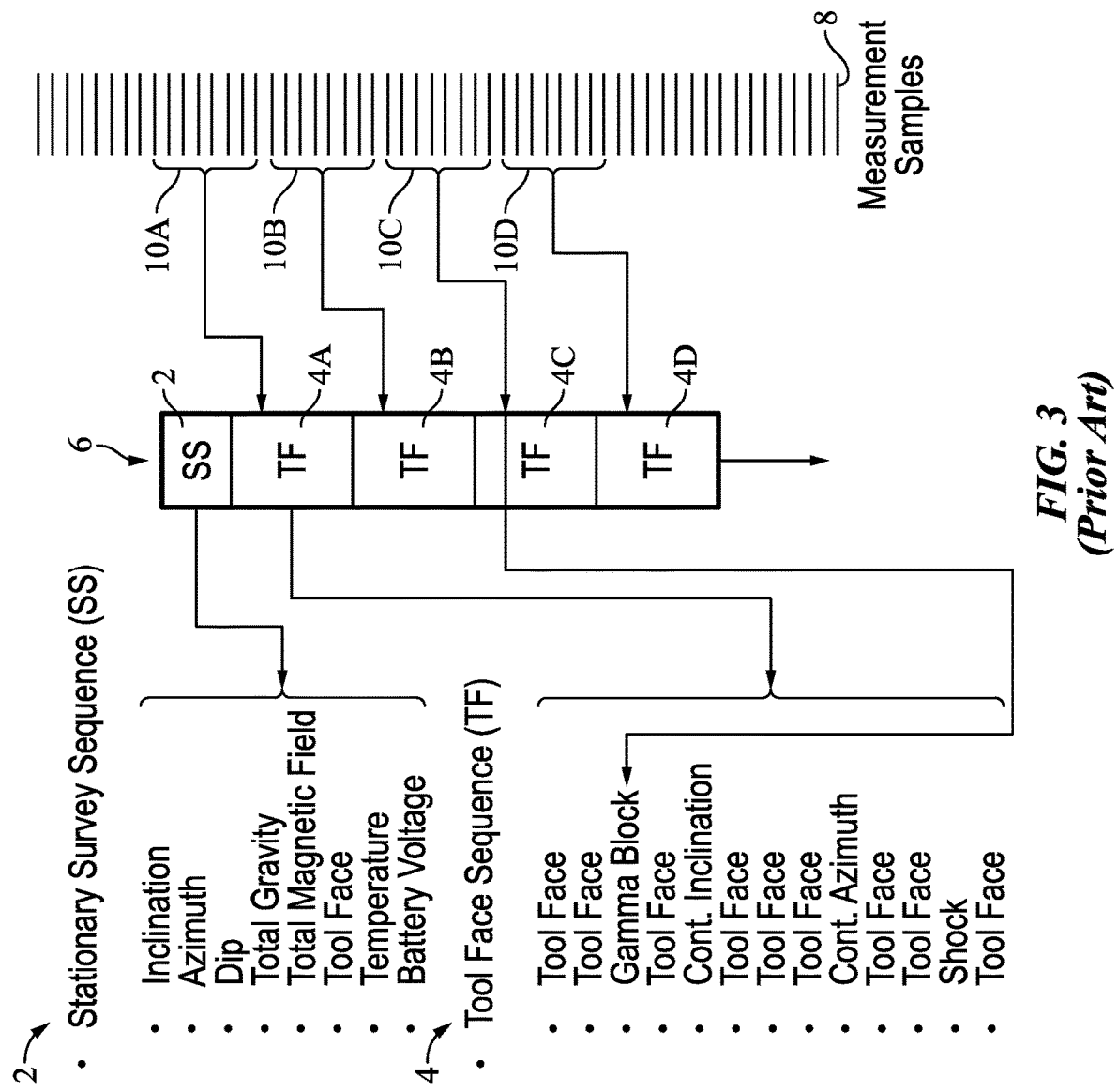
FIG. 3 is a schematic diagram of an exemplary set of measurement blocks that can be communicated via telemetry.
Figure 4:
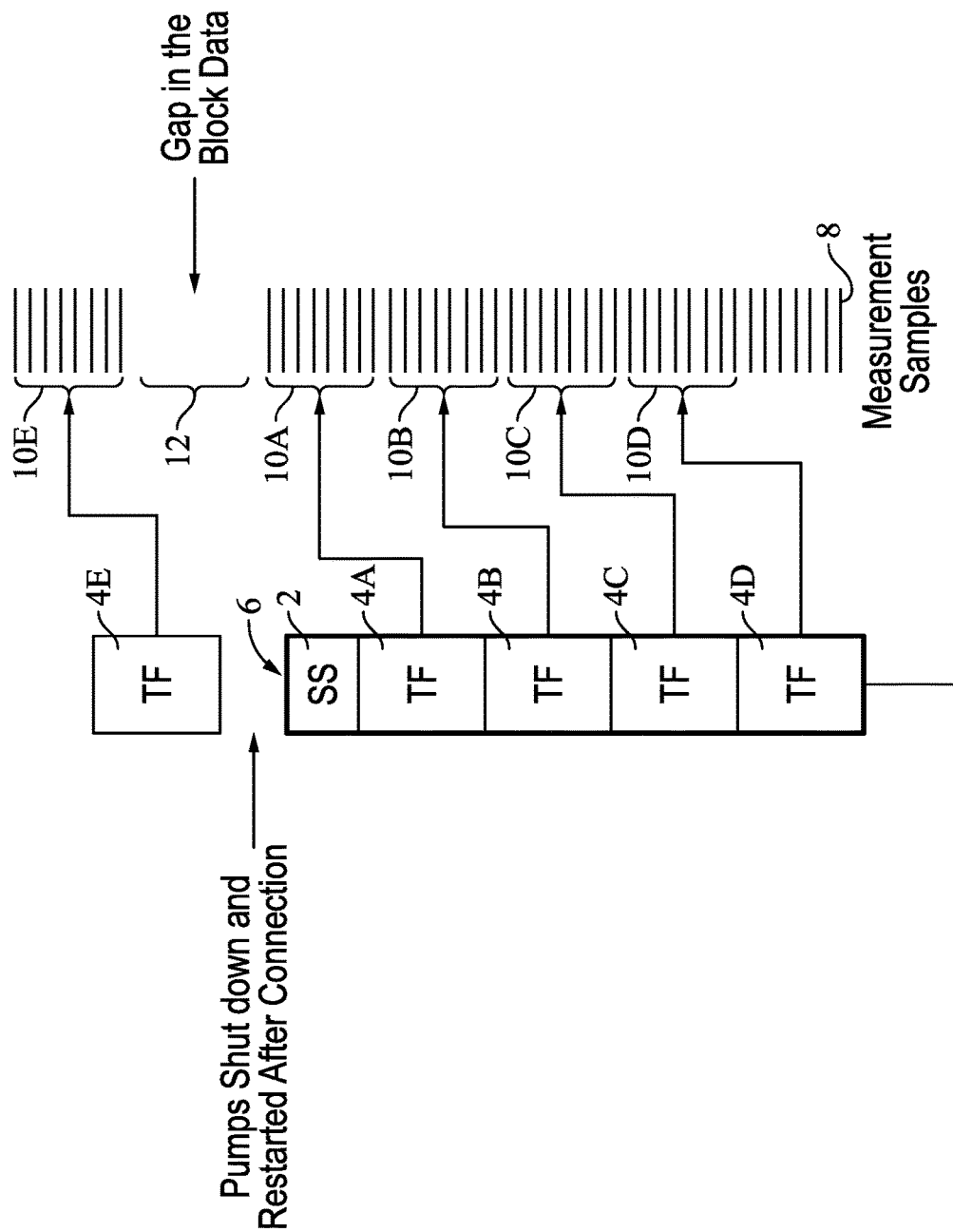
FIG. 4 is a schematic diagram of telemetry sequences illustrating a gap when operations begin before or while a Stationary Survey sequence is transmitted.
Figure 5:
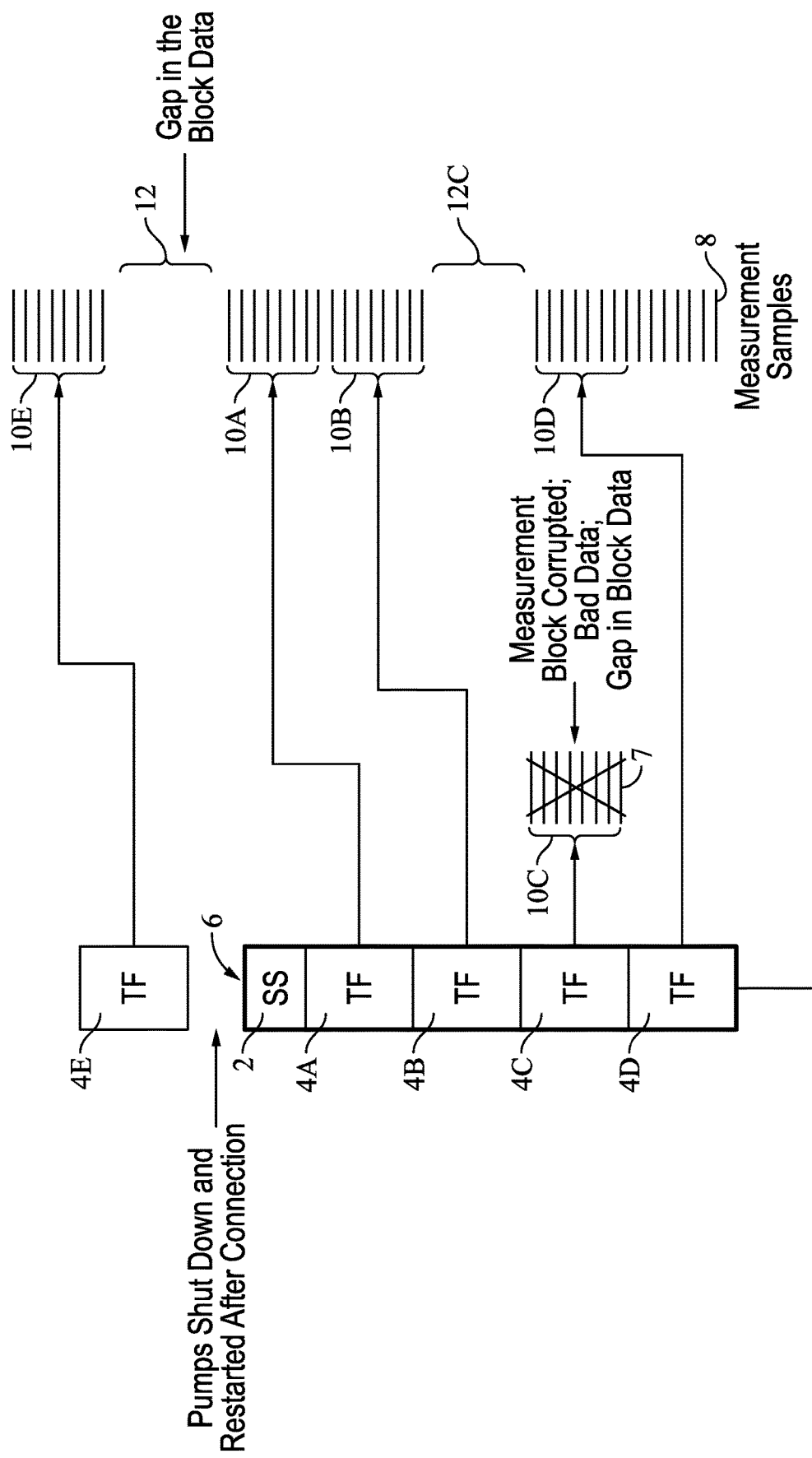
FIG. 5 is a schematic diagram of telemetry sequences illustrating two types of gaps described herein.

In the example shown in FIG. 6B, a sequence set 18E differs from the typical sequence set 6 described in FIGS. 2-4 with a special TF sequence 14C producing a CMB 32C. In this embodiment, the CMB 32C can include at least a second portion, as an SMB 26C, and a normal MB 10C. The CMB 32C can include an overlapping portion 24C, as well. The SMB 26C contains measurement data corresponding to at least a time interval that the interrupting sequence 44 was being sent while operations were occurring, that is, when at least a portion of a normal MB, such as shown in FIG. 3, would have been otherwise sent via telemetry. This CMB 32C from the TF sequence 14C can be predetermined and configured in the downhole MLWD tool in conjunction with uphole software at a receiving station. In this embodiment, the TF sequence 14C can have a same sampling frequency as a normal MB, such as MB 10B, but with a higher number of samples, resulting in the longer CMB 32C with the SMB 26C. The first portion 24C with additional data can overlap an earlier MB and can be discarded if the data is not needed to fill other gaps, such as discussed herein. A special identifier can be sent with the CMB 32C to alert the receiving station of the additional data and purpose. The SMB 26C data can be identified based on the occurrence of the interrupting sequence or another indicia of a progression of data sampling such as a Sequence ID, so that the data processing can determine, if needed, the existence of a gap 12C of the measurement data stream 8 to extract the appropriate samples from the SMB 26C. The SMB 26C can be extracted by the receiving station and used to fill a gap 12C caused by the interrupting sequence being sent in telemetry.

Figure 7:
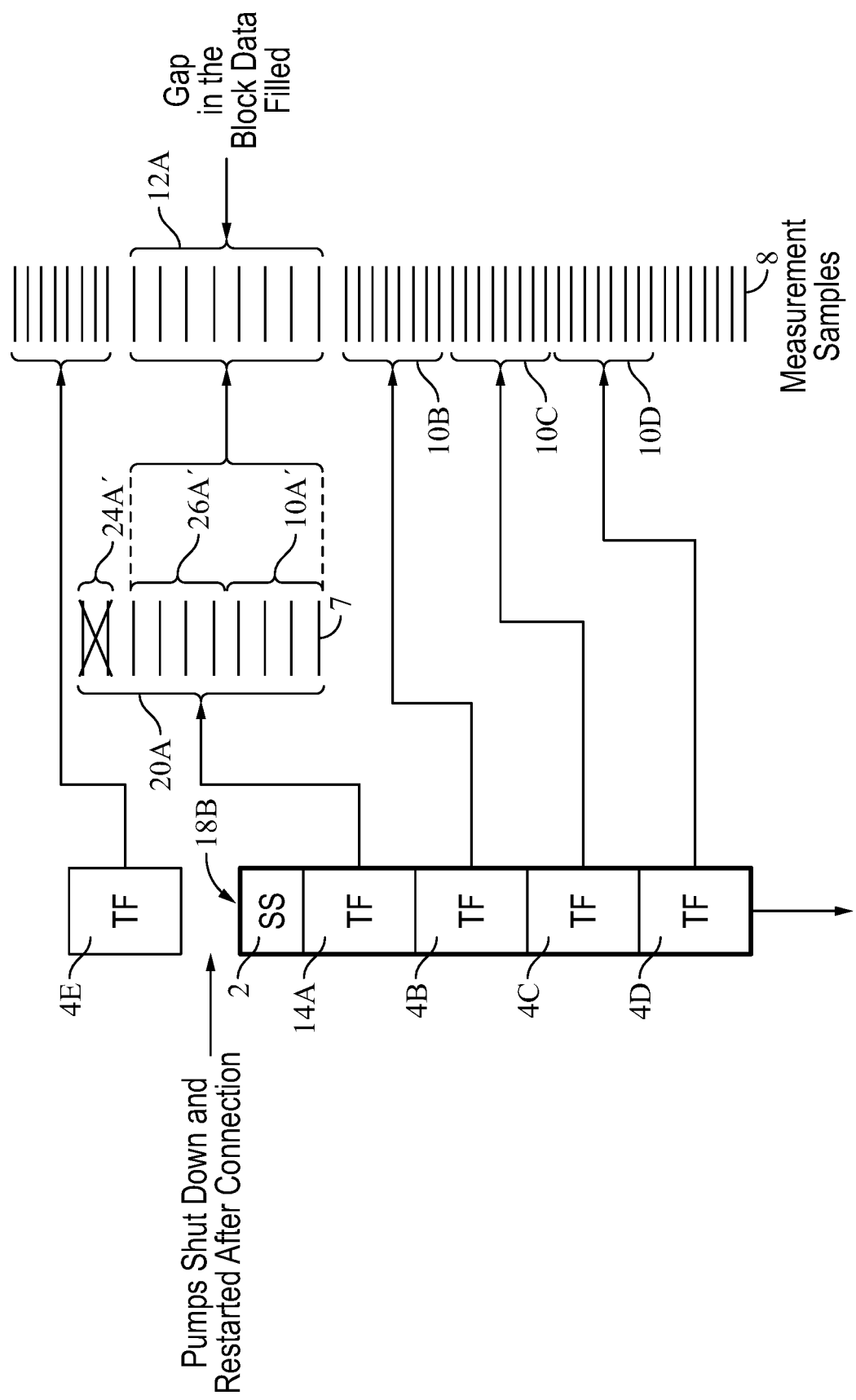
FIG. 7 is a schematic diagram of another embodiment of the present invention that can fill in a gap from missing data.

FIG. 7 is a schematic diagram of another embodiment of the present invention that can fill in a gap from missing data. FIG. 7 shows another solution to filling a gap 12A of the measurement data stream 8 that can be created due to the prematurely starting operations, such as drilling, without waiting for the SS sequence 2 data to finish. Like the embodiment in FIG. 6A, a sequence set 18B differs from the typical sequence set 6 described in FIGS. 2-4 with a special TF sequence 14A producing a special combined MB 20A. Similar to the embodiment in FIG. 6A, the combined MB 20A can include at least an SMB 26A' and a MB 10A', and can include an overlapping portion 24A. The SMB 26A' contains measurement data corresponding to at least a time interval that the SS sequence 2 was being sent while operations were occurring, and the MB 10A' contains data for the next time interval of a normal MB such as shown in FIG. 3. However, in this embodiment, the SMB 26A' and MB 10A' have a lower sampling frequency than normal but with a normal number of samples that might occur at a sampling frequency for just a normal MB 10B. The effect is the combined MB 20A having a longer time interval than a normal MB 10B but with a normal number of samples of the MB 10B. The lower time-resolution may be acceptable when changes in the strata are slow. The system is configured to check the existence of the prior MB data. If the prior MB data exist and overlaps with the first portion 24A then the first portion 24A can be discarded, as shown. The SMB 26A' can be used to populate the measurement data stream 8 from the TF 14A as normally occurs, albeit with a lower sampling frequency compared to, for example, the illustrated MB 10B. Also, combinations of the embodiments in FIG. 6 and FIG. 7 with sampling numbers and sampling frequencies can be used in coordination with the receiving station software for interpretation of the data. The embodiment in FIG. 7 of the special sequence for an SS sequence described can be applied in like fashion to the alternative embodiment of an interrupting sequence described in FIG. 6A.

Figure 8:
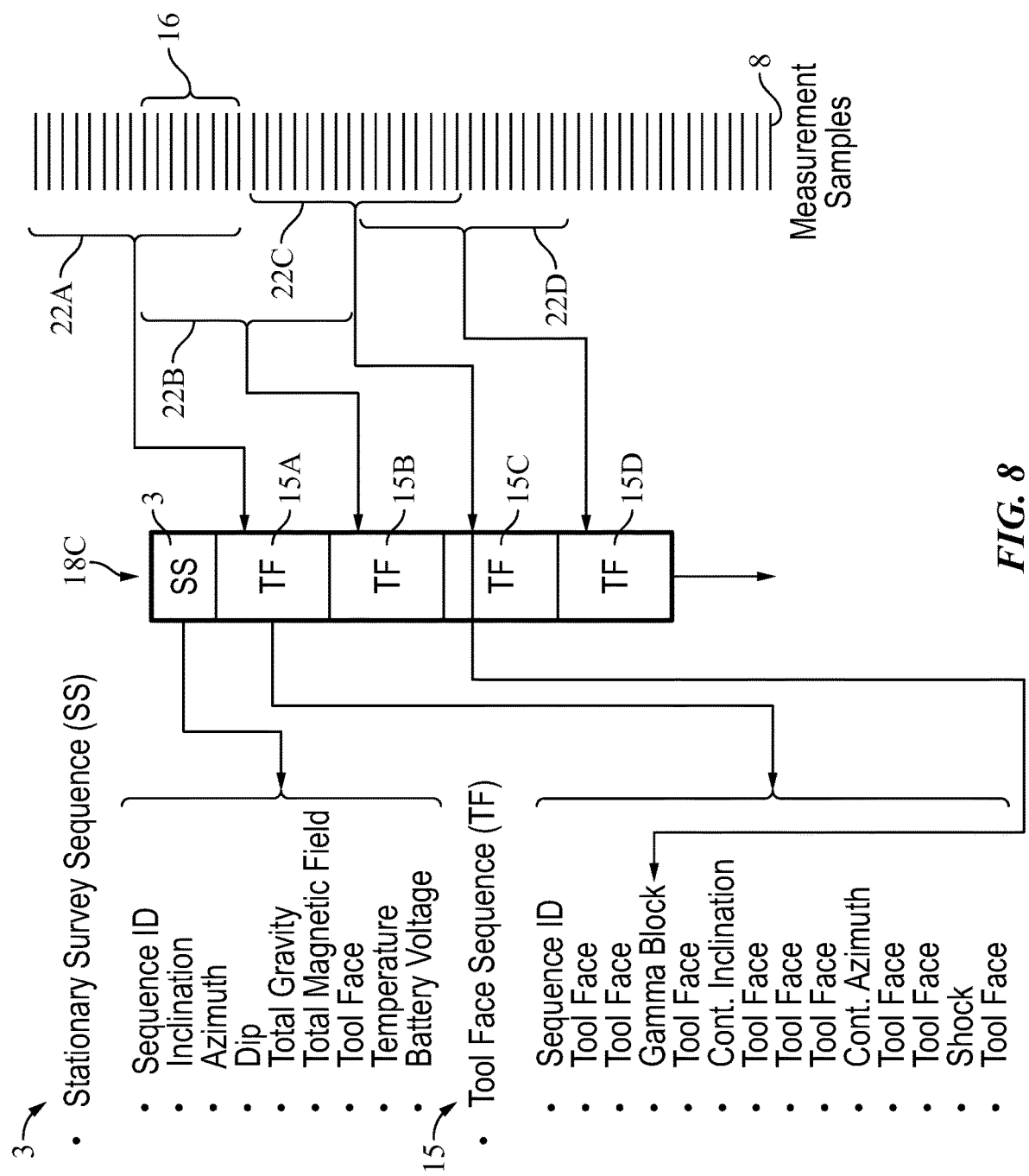
FIG. 8 is a schematic diagram of an embodiment of the present invention that shows a stream of measurement samples acquired by an MLWD tool and converted to MB data with overlapping measurement samples to be transmitted to a receiving station via telemetry.
Figure 9:
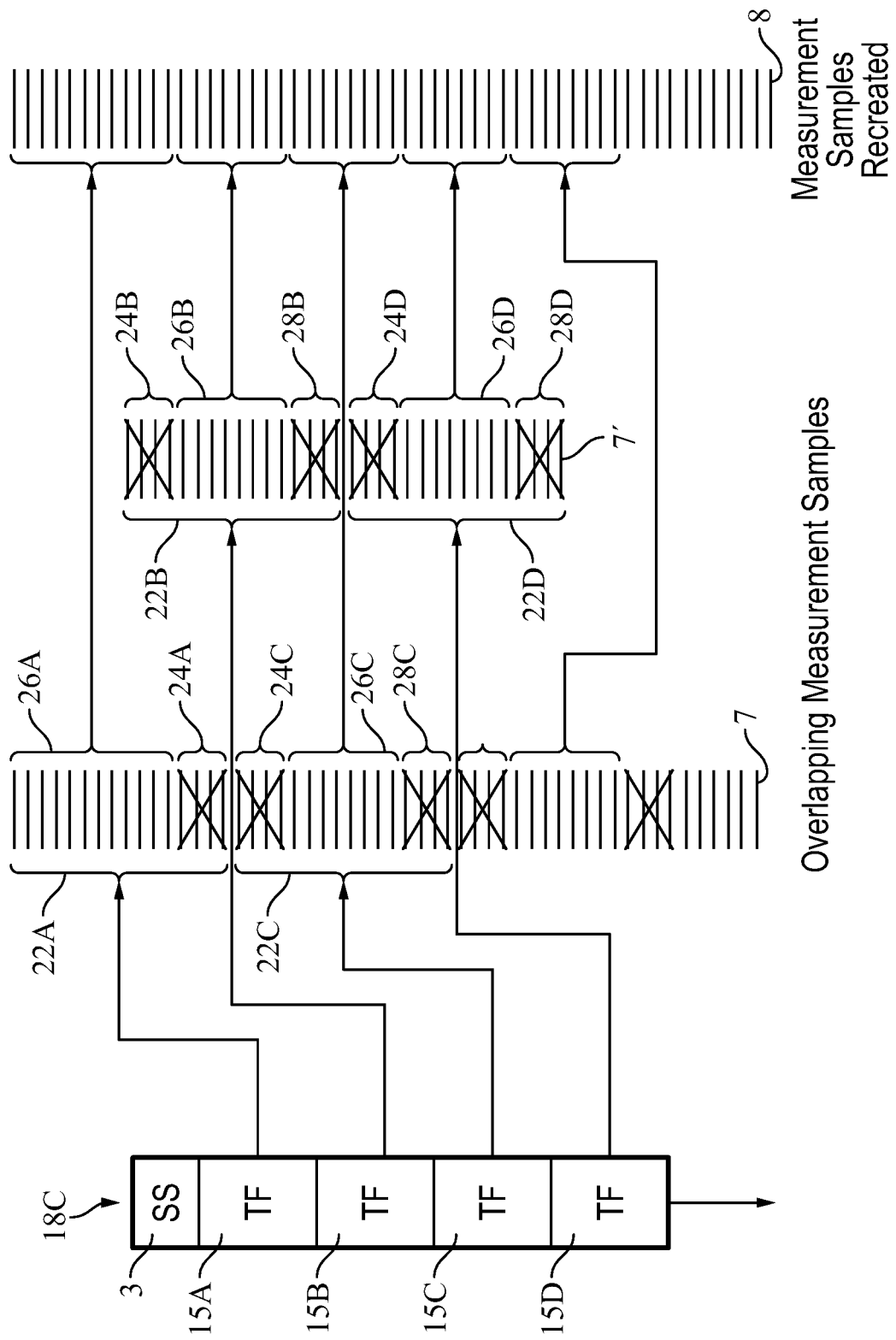
FIG. 9 is a schematic diagram of the embodiment of FIG. 8 illustrating a receiving station processer recreating a data stream with overlapping samples for each MB data received.
Figure 10:
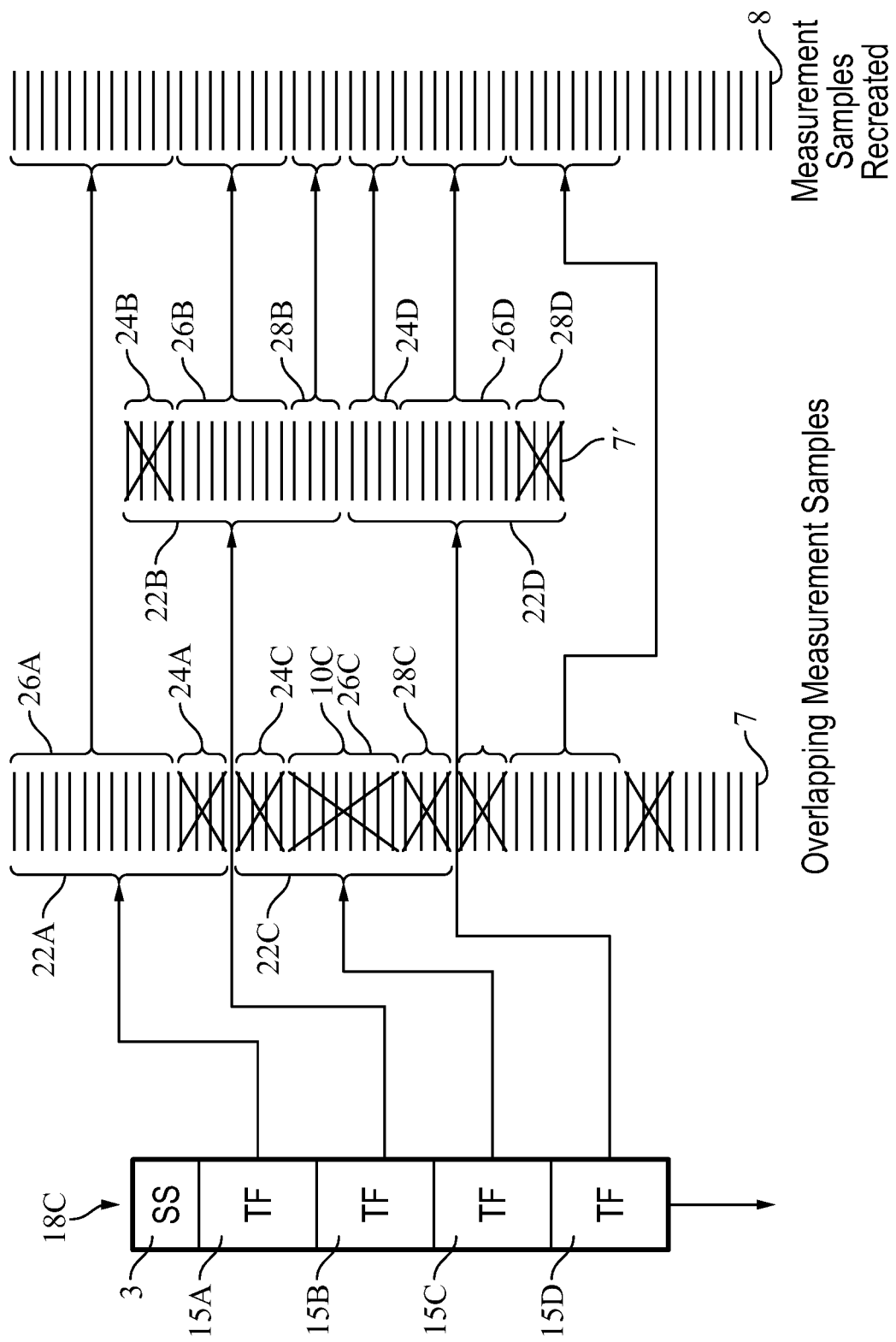
FIG. 10 is a schematic diagram of the present invention showing how the gap created by corrupted data is filled with overlapping MB data of FIG. 8.

FIGS. 8, 9 and 10 illustrate an embodiment of a solution for the gaps created by noisy telemetry. Noisy telemetry can cause some of the MB data received by the receiving station processor to be incorrect due to corrupted telemetry data. The receiving station processor likely cannot recreate substantially equivalent samples acquired downhole by the MLWD tool. When the telemetry is expected to be noisy, the MLWD tool and the receiving station processor can be configured for overlapping MB data. The duplicate data recreated by the receiving station processor, such as after decompressing the overlapping MLWD compressed data, can be discarded if all the MB data received is acceptable.

FIG. 8 is a schematic diagram of an embodiment of the present invention that can fill a gap caused by corrupted data. The embodiment includes directing the downhole MLWD tool to take overlapping measurement samples to create at least one overlapping measurement block ("overlapping MB" or "OMB") to be sent in the telemetry to the receiving station. To maintain proper identification of data, a sequence number can be included with the SS sequence 3 and the overlapping TF sequences 15, as shown in the listings of the sequences. The TF sequences 15 can have overlapping MBs 22 with overlapping measurement samples. The inclusion of a sequence ID is a nonlimiting example and other forms of organizing the overlapping MB data can be used, such as time stamping the measurement samples, and other methods. As an example of overlapping, TF sequences 15A can be initiated to produce OMB 22A with measurement samples. TF sequence 15B can be initiated to produce OMB 22B with an overlapping portion 16 having measurement samples that overlap OMB 22A and a next OMB 22C. In this nonlimiting example, the overlap can be one-half and other overlapping fractions can be designed. TF sequence 15C produces OMB 22C with a portion having measurement samples that overlap OMB 22B and a next OMB 22D. TF sequence 15D produces OMB 22D with a portion having measurement samples that overlap OMB 22C and a next OMB (not labeled). While FIG. 8 shows the overlapping portions of data from former-and-following OMB data, it is also possible to overlap data in other ways.

As a further nonlimiting example, at least one OMB 22 could be fully overlapped with a preceding or following OMB.

FIG. 9 is a schematic diagram of the embodiment of FIG. 8 illustrating a receiving station processer recreating a data stream with overlapping samples for each OMB received. The MLWD tool can compress and send the OMB data via telemetry to the receiving station for processing. The receiving station processor can extract the data and analyze the data. To illustrate diagrammatically, the overlapping portions are shown in the intermediate measurement samples 7 that can result in the measurement data stream 8, after filling in any gaps and discarding remaining extraneous measurement samples. In this illustration, all OMB data received via the telemetry by the receiving station is good and usable. Hence, all the overlapping data is not needed and can be discarded.

In this example, for the TF sequence 15A with the OMB 22A, a first portion 24A can be discarded and a second portion 26A can be used to supply the measurement data stream 8. For the TF sequence 15B with the OMB 22B, a first portion 24B can be discarded that overlaps the second portion 26A of OMB 22A that is used for the measurement data stream 8, and a second portion 26B can be used to supply a next portion for the measurement data stream 8. For the TF sequence 15C with the OMB 22C, a first portion 24C can be discarded that overlaps the second portion 26B of OMB 22B that is used for the measurement data stream 8, and a second portion 26C can be used to supply a next portion for the measurement data stream 8. Because the second portion 26C is used for the measurement data stream 8, then the third portion 28B of OMB 22B can be discarded as overlapping. For the TF sequence 15D with the OMB 22D, a first portion 24D can be discarded that overlaps the second portion 26C of OMB 22C that is used for the measurement data stream 8, and a second portion 26D can be used to supply a next portion for the measurement data stream 8. Because the second portion 26D is used for the measurement data stream 8, then the third portion 28C of OMB 22C can be discarded as overlapping.

The process can continue with additional TF sequences 15, until there is a break in the sequence such as when adding another drill pipe as discussed above or other event, where a new sequence set 18 may start. For the remaining TF sequences in the measurement data stream 8, the second portion 26 from each OMB 22 in a given TF sequence 15 can be used and the first portion 24 and third portions 26 from each MB can be discarded. However, if a TF sequence has a gap, then the first portion and/or third portion of other TF sequences, before and/or after the TF sequence causing the gap may be used. The overlapping MB data provides a level of redundancy to fill the gap if required, such as due to noisy telemetry conditions. The use of the second portion of the OMB 22 is just one example to recreate measurement data stream 8 from the downhole MLWD tool; but in other examples, either the first portion of the OMB or the third portion of the OMB can be used to recreate the measurement data stream 8.

FIG. 10 is a schematic diagram of another example of the embodiment of FIG. 8. Similar to the example in FIG. 9, the MLWD tool can compress and send MB data via telemetry to the receiving station for processing. As in the example of FIG. 9, the first portion 24A of the OMB 22A from the TF sequence 15A can be discarded and the second portion 26A used for the measurements samples stream 8. For OMB 22B, the first portion 24B can be discarded and the second portion 26B used for the measurements samples stream 8. However, in this example, the second portion 26C of OMB 22C is corrupted. To recreate the corrupted second portion 26C, the overlapping third portion 28B from the OMB 22B that is normally discarded can be used to fill partially the gap created by the corrupted second portion 26C. To fill the remainder of the corrupted second portion 26C, the first portion 24D of the OMB 22D that is normally discarded in this embodiment can be used. A third portion 28C can be discarded. Thus, even if a whole MB is corrupted, the two temporal overlapping MBs can fill a gap caused by the corrupted data. For the remaining TF sequences 15, the second portion 26 from each recreated MB in a given TF sequence can be used and the first portions 24 and third portions 28 from each MB can be discarded.

Figure 11:
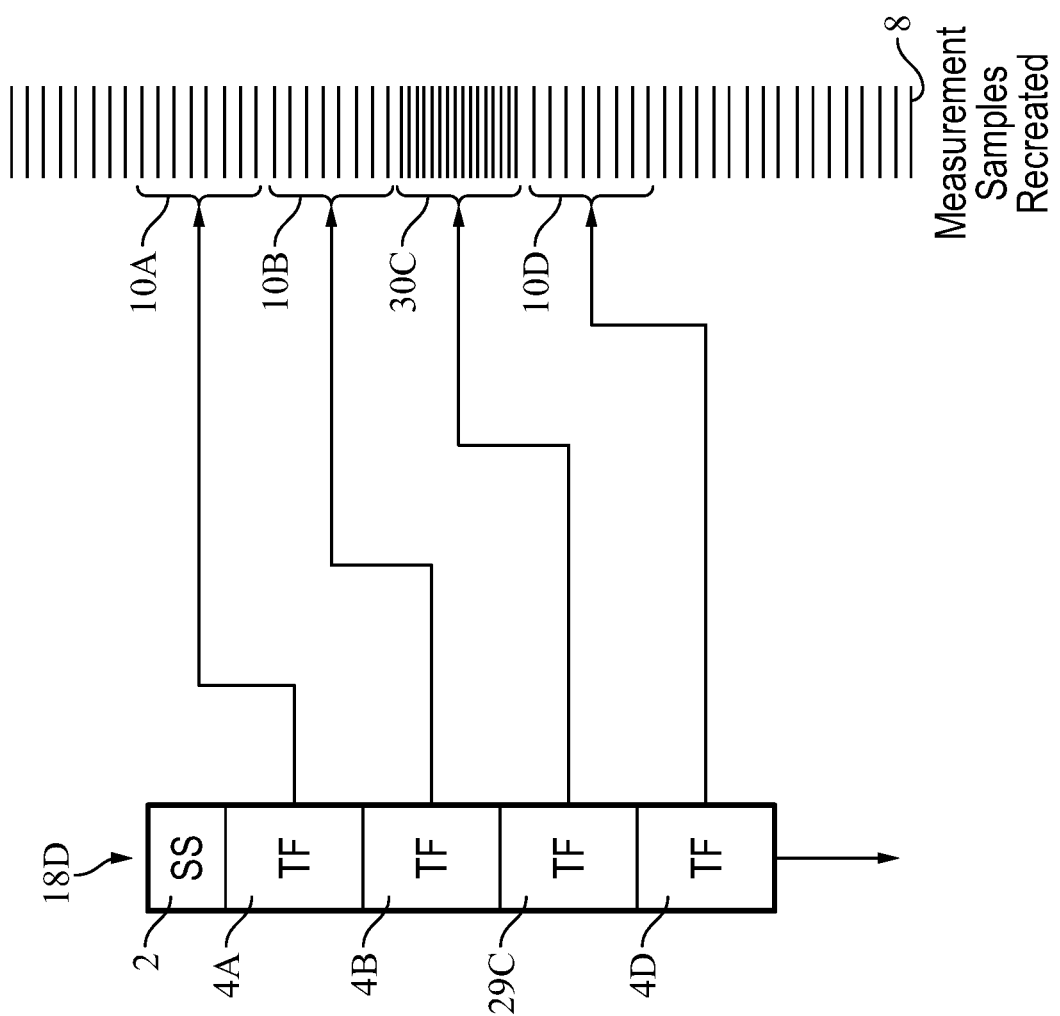
FIG. 11 is a schematic diagram of another embodiment of the present invention that can fill a gap caused by a gap event, such as a high rate of penetration drilling.

FIG. 11 is a schematic diagram of another embodiment of the present invention that can fill a gap caused by a gap event, such as a rate of change of a given parameter outside of an acceptable variance. The solution illustrated in FIG. 11 can help fill a gap in information by resolving the fast-changing measurement more accurately. As an example, the result can increase the accuracy of determining a hydrocarbon layer bed boundary and estimating a thickness of thin hydrocarbon beds or small objects that could be indicated in the measurement data stream 8 with sufficient data. Whenever the downhole MLWD tool detects a gap event, the MLWD tool can initiate a TF sequence 29C in a sequence set 18D to create an event measurement block ('event MB" or "EMB") 30C of data. To assist in providing an opportunity for the MLWD tool to make such a detection, for example, measurement data at a rate different than a standard sampling rate that is compressed for telemetry, where the different rate could be a higher sampling rate or even the highest sampling rate possible by the MLWD tool. Such measurement data can be held in a buffer for a given time. (Measurement data at such a sampling rate can also apply to other types of gaps, MBs, and used with the various decisions herein, and so can be used as a default standard for acquiring data that may or may not be sent in telemetry to the receiving station.) If the data from the different sampling rate is not needed, then it can be discarded. If needed, the event MB 30C can aggregate data at a different sampling rate than a predetermined sampling rate of one or more other MBs in the sequence set 18D such as an adjacent MB like TF sequence 4B (or other TF sequences described herein). In many instances, the event MB 30C contains more measurements for the same time interval as a normal MB in the sequence set 18D. The event MB 30C measurement samples can be used to fill a gap of insufficient data, such as with a higher resolution from an increased sampling rate. The event MB 30C can have an embedded or other identifier to signify that the MB is an event MB. The receiving station can identify the event MB 30C and can recreate the samples accordingly. The event sampling rate in this example can be predetermined. However, in some embodiments, the rate may be determined in real time to best fit a given condition, such as by providing artificial intelligence to the downhole MLWD tool. While FIG. 11 illustrates only one block as an event MB 30, it is possible to have multiple event MBs in the sequence set.

Figure 12A:
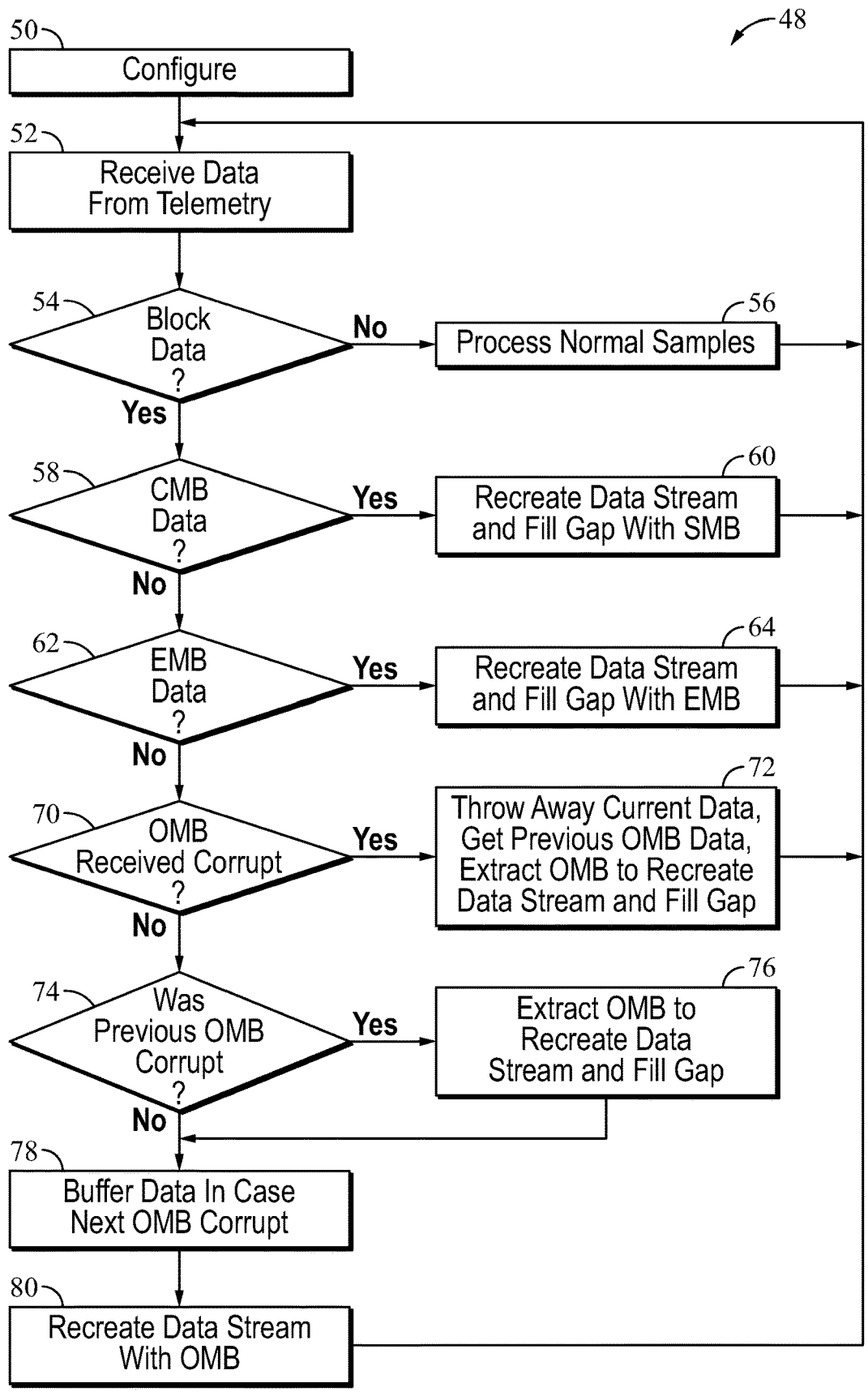
FIG. 12A is an embodiment of a flow chart of an exemplary method for analyzing the measurement samples data by a receiving station processor.

FIG. 12A is an embodiment of a flow chart of an exemplary method for analyzing the measurement samples data by a receiving station processor. In the method 48 for step 50, an acquiring unit, such as the MLWD tool described above, and a receiving station processor can be configured with a predetermined configuration of sequences including for possible identifiers for variations of the different MBs described herein, decoding of sequence identifiers, and project specific anomalies that may be anticipated to occur. With the configuration understood between the acquiring unit and the receiving station, the method can progress to transmitting, receiving, and processing data in a loop for the various sequences in a sequence set 18 to create the relevant data stream 8, as described above. Generally, a new measurement sample in the sequence set will start a new loop which may or may not need further configuration communications between the acquiring unit and the receiving station, depending at least partially on the requirements of new sequence set. In some embodiments, the data can be buffered for various MBs and at various times to allow time for processing subsequent data that may have a gap that the buffered data can be used to fill.

A determination of the gap and/or type of gap for which solution to apply can be performed. In some embodiments, the cause of the gap of data can be determined, and based on the cause, use a type of measurement block designed for that type of gap to extract data therefrom and at least partially fill the gap. The determination can occur downhole, such as with the MLWD tool, or the determination can occur uphole, such as at the receiving station or other location of a processor handling the data. As an example, the method and system can determine if a gap of data exists in a data stream and a cause of the gap, and if the cause is by a special sequence being sent in telemetry such as during a time an MB would have been sent due to operations, then the method and system can use a CMB of data to at least partially fill the gap and supply the next set of data for the data stream. Further, the method and system can determine if a gap of data exists in a data stream and a cause of the gap, and if the cause is by a gap event, then fill at least partially the gap with data from an EMB with a sampling rate that is different than a predetermined sampling rate. Still further, the method and system can determine if a gap of data exists in a data stream and a cause of the gap, and if the cause is by corrupted data in the MB, then discard the corrupted data for a corresponding time interval, and fill at least partially the gap with data from at least one of an adjacent OMB corresponding to the time interval of the corrupted data.

In some embodiments, the system may be configured to automatically create a CMB, EMB, or OMB, such as based on a prior event occurring or a known issue for the particular operation. For example, when the system knows that an SS sequence is going to be sent, the determination can be made that a gap will be presumed and to automatically create a CMB to be used to recreate a data stream whenever an SS sequence will be sent. As another example, when a known noisy environment exist, then an OMB may be a standard MB for that operation with a determination that the expected gaps will be caused by corrupted data. Such determinations and the resulting planned protocols are included within the scope of determining if a gap exist for purposes herein and/or the cause thereof.

In step 52, with the understanding that the underlying system is functioning, such as mud flow from pumps, the MLWD tool can transmit data from sequences used to create the various MBs described herein, including CMBs, EMBs, OMBs, and MBs with samples via telemetry for receipt by the receiving station.

In step 54, a decision is made on whether the measurement sample is a type of MB. If not, then the data is generally a single sample and, in step 56, normal processing can occur of ordering the single sample into the measurement stream equivalent to measurement data stream 8 described above to recreate a data stream intended from the MLWD tool to the receiving station. The method can return to step 52 for more data.

In step 54, if the data is a type of MB, then in step 58, the MB is evaluated on whether the MB is a CMB, that is, a combined MB with an SMB. The CMB can be used to at least partially fill a gap caused by a special sequence being sent in telemetry during operations at a time interval that would otherwise have been occupied by sending MB data. If the MB is a CMB, the data stream relevant to the CMB can be recreated in step 60 with SMB data to at least partially fill the gap, along with the MB data from the CMB generally of the next time interval after the SMB. The method can return to step 52 for more data. If the MB is not a CMB, the MB can be evaluated in step 62 on whether the MB is an EMB, that is, an event MB. The EMB can be used to at least partially fill a gap caused by a gap event. If the MB is an EMB, the data stream relevant to the EMB can be recreated in step 64 to fill the gap. The method can return to step 52 for more data. If the MB is not an EMB, then in this embodiment, the MB can be an OMB, and the OMB can be evaluated in step 70 for corrupted data. If OMB contains corrupted data, the corrupted data can be discarded in step 72. In some embodiments, the whole OMB can be discarded due to the logistically difficulties in separating the corrupted data from uncorrupted data. Also, in step 72, data from a prior OMB that overlaps the corrupted data can be retrieved and that data used to recreate the data stream and at least partially fill the gap created by the corrupted OMB. The method can return to step 52 for more data. Further regarding step 70, if the OMB is not corrupted, the method can check in step 74 for whether a previous OMB was corrupted that overlaps the current OMB. If the previous OMB was corrupted, the current OMB data can be extracted in step 76 to at least partially fill the gap of data of the previous corrupted OMB that was described above in step 72. If the previous OMB was not corrupted, the OMB data can be temporarily buffered in step 78 for possible use on a succeeding OMB that might need data from the current OMB. In step 80, the current OMB data can be used to recreate the data stream for the applicable time interval of the OMB, and the method returns to step 52 for further data. It is understood as a practical reality that not all data may be available to fill a gap entirely and so filling a gap means at least partially filling a gap in this paragraph and throughout the application, unless expressly stated otherwise.

Figure 12B:
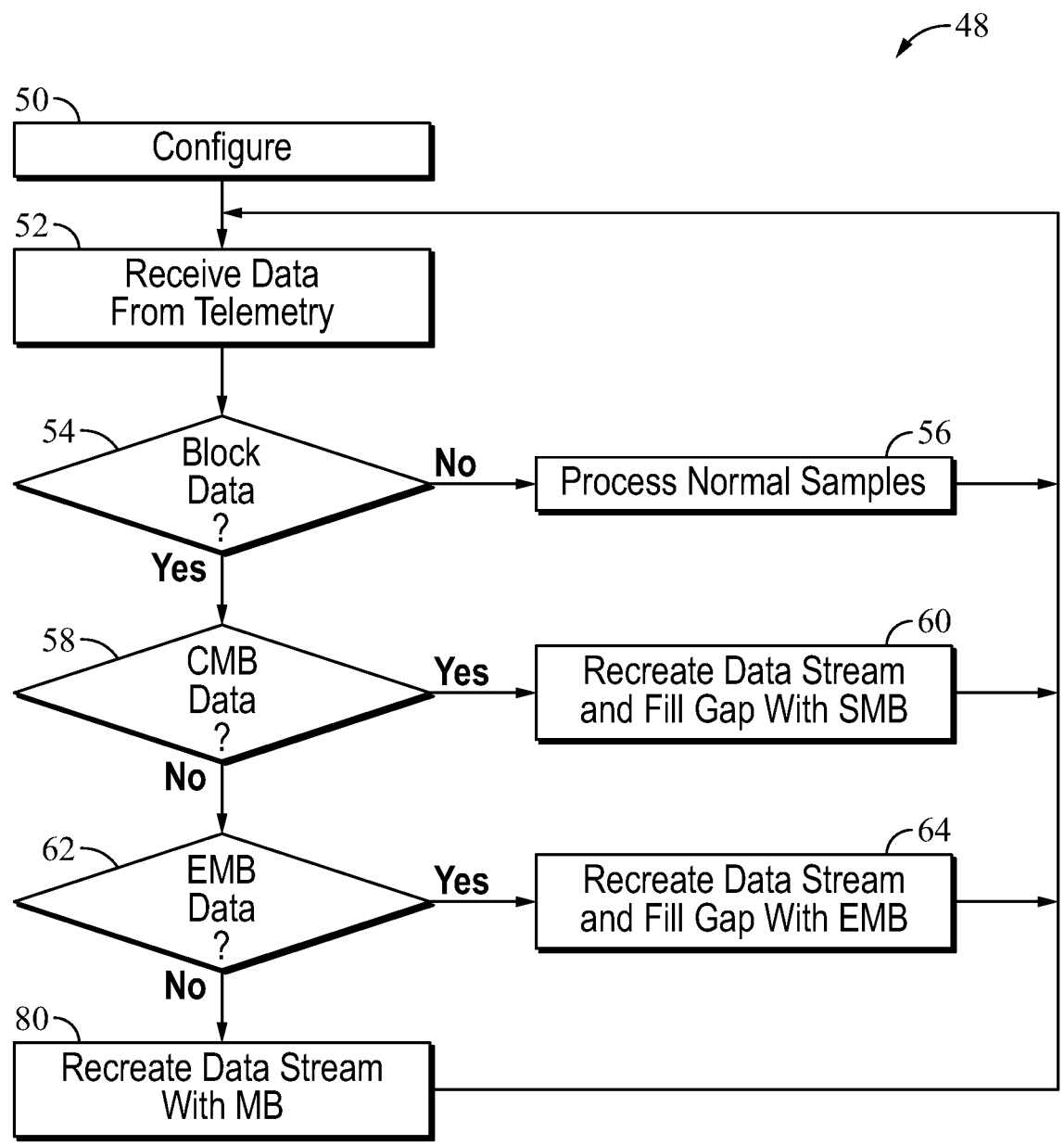
FIG. 12B is another embodiment of a flow chart of an exemplary method for analyzing the measurement samples data by a receiving station processor.

FIG. 12B is another embodiment of a flow chart of an exemplary method for analyzing the measurement samples data by a receiving station processor. The embodiment in FIG. 12B is similar to the embodiment in FIG. 12A. In this embodiment, the OMB may not be used. The OMB may not be present, for example, when the well environment has little noise and the data is generally uncorrupted. Thus, if the MB type is not a CMB in step 58 or an EMB in step 62 as the flowchart explains in FIG. 12A, then the MB can be considered a standard MB that can be processed to recreate the data stream in step 80.

Figure 13:
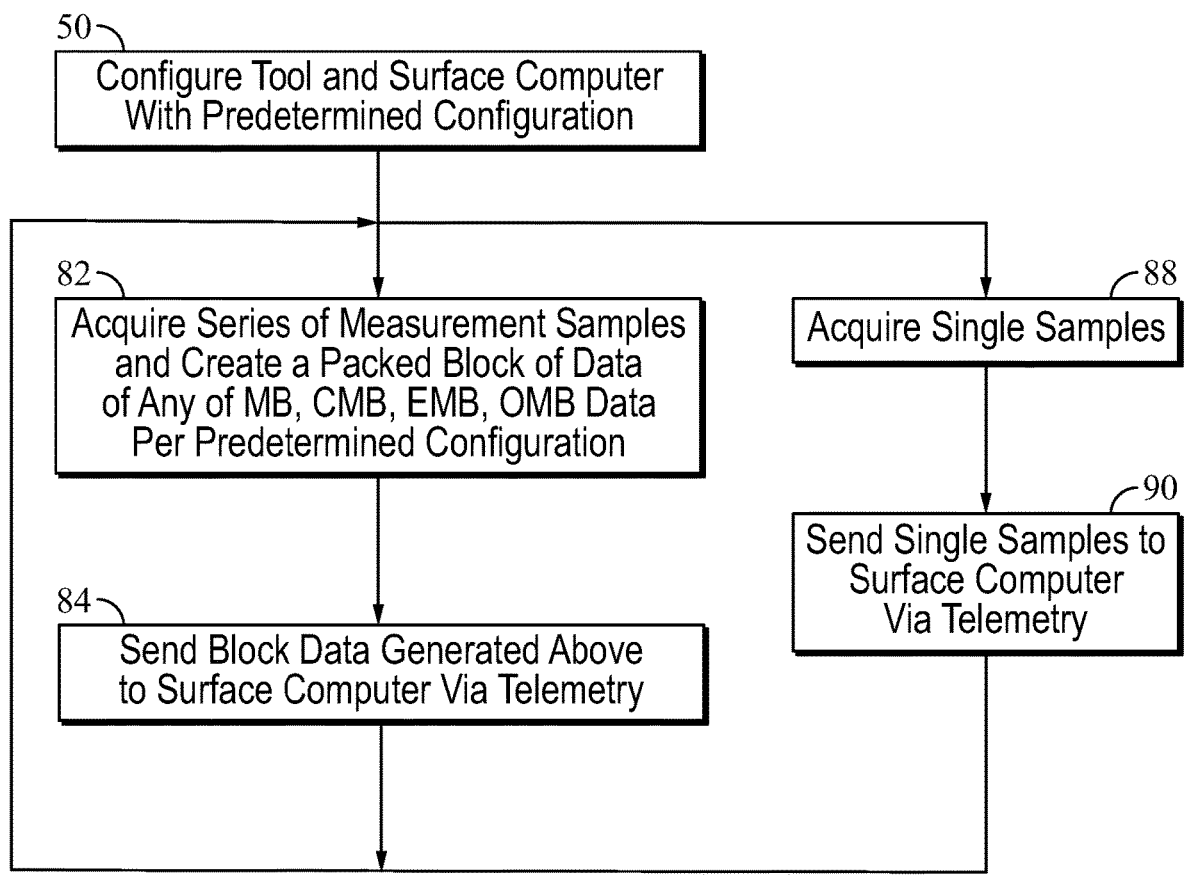
FIG. 13 is an embodiment of a flow chart of an exemplary method for acquiring measurement samples and sending the measurement samples to the receiving station.

FIG. 13 is an embodiment of a flow chart of an exemplary method for acquiring measurement samples and sending the measurement samples to the receiving station. From the perspective of the acquisition unit, such as the MLWD tool described above, the step 50 described in FIG. 12A and/or FIG. 12B apply, where the acquiring unit and the receiving station processor can be configured with a predetermined configuration to send and to interpret the telemetry passing between them. In step 82, a series of measurement samples can be collected and created into a compressed data block as an MB with some MB created as a CMB, EMB, and/or OMB for a given situation. In step 84, the MBs can be sent via telemetry to the receiving station. For various types of measurements, in step 88, the acquiring tool can acquire single samples and in step 90 send the single samples via telemetry to the receiving station.

Figure 14:
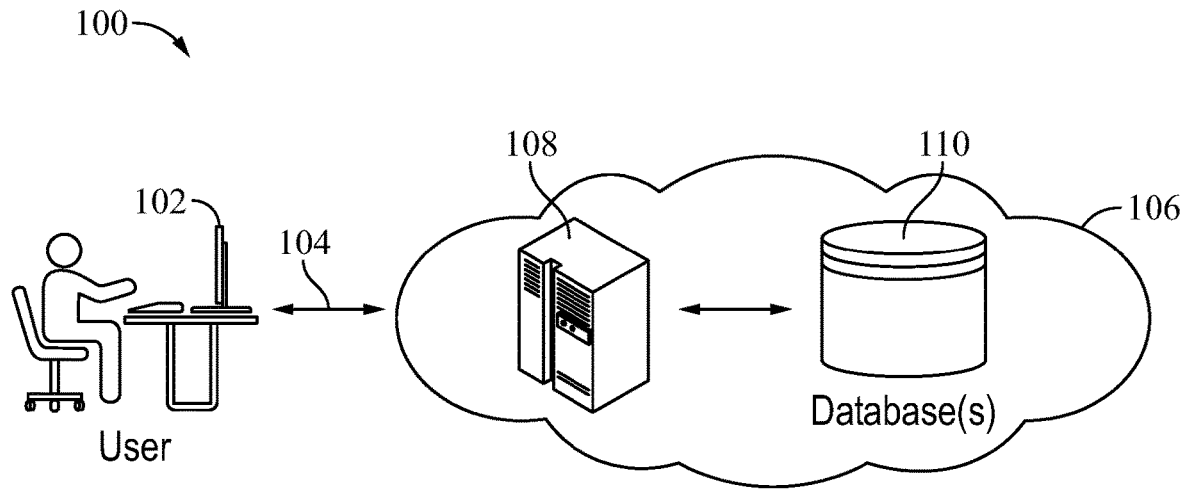
FIG. 14 illustrates an example of a computing system in which the steps for enhancement in telemetry communications between a downhole transmitting tool in a hydrocarbon wellbore and a receiving station can be implemented.

FIG. 14 illustrates an example of a computing system in which the steps for enhancement in telemetry communications between a downhole transmitting tool in a hydrocarbon wellbore and a receiving station can be implemented. As can be seen, the system can include at least one receiving station 102 that can be connected via a network connection 104 to a network 106. In the present example, the user-processing device 102 may be a desktop computer, notebook computer, tablet, smart phone, and other processing device, and the network connection 104 may be a wired and/or wireless network connection. Alternatively, the processing device 102 may be a stand-alone system that does not interface with a network or network servers. One or more network servers 108 may be connected to the network 106 with at least one database 110, which may be either an internal database that resides within the network servers 108, or a database that resides in a physically separate location from the network servers 108 (as shown here), depending on the constraints (e.g., size, speed, etc.) of the particular implementation. Note that the term "server" is used herein to include conventional servers, as well as high-end computers, workstations, mainframes, supercomputers, and the like. Similarly, the at least one database 110 may be a relational database, operational database, or other suitable database capable of storing data and information, including rules and criteria to define the normal patterns and anomaly patterns with potential associated disorders of the floating platforms and training examples for an expert system, pattern recognition, results of analysis, and other data as relevant to the processes described herein.

Figure 15:
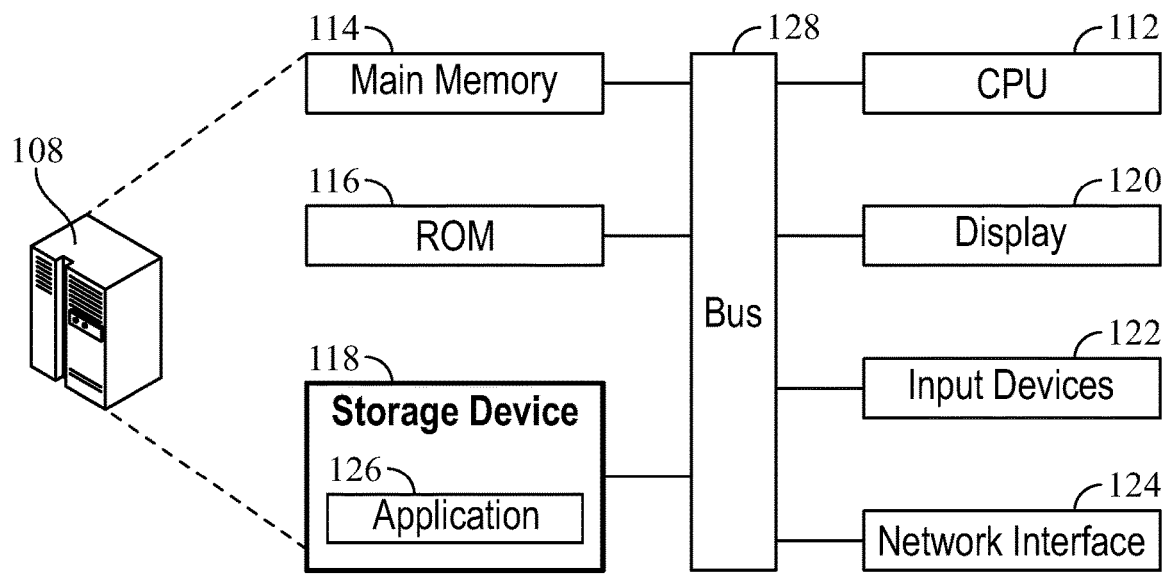
FIG. 15 illustrates an illustrative server that may be used as one of the one or more servers on the computing network.

FIG. 15 illustrates an illustrative server that may be used as one of the one or more servers 108 on the computing network 106. As mentioned earlier, this server 108 may be any suitable data processing system known to those having ordinary skill in the art, including a high-end server, workstation, mainframe, supercomputer, and the like. Such a server 108 typically includes a bus 128 or other communication mechanism for transferring information within the server 108, and a CPU 112 coupled with the bus 128 for processing the information. The server 108 may also include a main memory 114, such as a random access memory ("RAM") or other dynamic storage device coupled to the bus 128 for storing computer-readable instructions to be executed by the CPU 112. The main memory 114 may also be used for storing temporary variables or other intermediate information during execution of the instructions to be executed by the CPU 112. The server 108 may further include a read only memory ("ROM") 116 or other static storage device coupled to the bus 128 for storing static information and instructions for the CPU 112. A computer-readable storage device 118, such as a magnetic disk, optical disk, or solid-state memory device, may be coupled to the bus 128 for storing information and instructions for the CPU 112.

The term "computer-readable instructions" as used above refers to any instructions that may be performed by the CPU 112 and/or other components. Similarly, the term "computer-readable medium" refers to any storage medium that may be used to store the computer-readable instructions. Such a medium may take many forms, including, but not limited to, non-volatile media, volatile media, and transmission media. Non-volatile media may include, for example, optical or magnetic disks, such as the storage device 118. Volatile media may include dynamic memory, such as main memory 114. Transmission media may include coaxial cables, copper wire, and fiber optics, including wires of the bus 128. Transmission itself may take the form of acoustic or light waves, such as those generated during radio frequency ("RF") and infrared ("IR") data communications. Common forms of computer-readable media may include, for example, a floppy disk, a flexible disk, hard disk, magnetic tape, other magnetic medium, a CD ROM, DVD, other optical medium, a RAM, a PROM, an EPROM, a FLASH EPROM, other memory chip or cartridge, or any other medium from which a computer can read.

The CPU 112 may also be coupled via the bus 128 to a display 120 for displaying information to a user. One or more input devices 122, including alphanumeric and other keyboards, mouse, trackball, cursor direction keys, and so forth, may be coupled to the bus 128 for communicating information and command selections to the CPU 112. A network interface 124 provides two-way data communication between the server 108 and other computers over the network 106. In one example, the network interface 124 may be an integrated services digital network ("ISDN") card or a modem used to provide a data communication connection to a corresponding type of telephone line. As another example, the network interface 124 may be a local area network ("LAN") card used to provide a data communication connection to a compatible LAN. Wireless links may also be implemented via the network interface 124. In summary, the main function of the network interface 124 is to send and receive electrical, electromagnetic, optical, or other signals that carry digital data streams representing various types of information.

In accordance with the disclosed embodiments, an application in system 102 and/or application 126 for a method for recovering some or all of the data lost to fill in gaps in telemetry, or rather the computer-readable instructions therefor, may also reside on the storage device 118. The computer-readable instructions for the application 116 may then be executed by the CPU 112 and/or other components of the server 108 to detect the disorders in the platforms. Such an application 126 may be implemented using any suitable application development environment and programming language known to those having ordinary skill in the art to carry out the steps of the algorithms disclosed and described herein. As noted above, in various embodiments, the application 126 may be a stand-alone application that may be executed independent of other applications, or it may be in the form of a plugin module to an existing software package, and the like.

Other and further embodiments utilizing one or more aspects of the invention described above can be devised without departing from the spirit of Applicant's invention. For example, combinations of gaps, and gap filling methods described herein are envisioned, the receiving station can be at a variety of locations, portions of the receiving station can be located at different physical locations, including cloud computing, and function as a receiving station for processing the data to yield results to on site personnel and remote personnel that may be monitoring operations, and the like can be used to enhance the operation and notification of the monitoring system, along with other variations can occur in keeping within the scope of the claims.

The invention has been described in the context of preferred and other embodiments and not every embodiment of the invention has been described. Obvious modifications and alterations to the described embodiments are available to those of ordinary skill in the art. The disclosed and undisclosed embodiments are not intended to limit or restrict the scope or applicability of the invention conceived of by the Applicant, but rather, in conformity with the patent laws, Applicant intends to protect fully all such modifications and improvements that come within the scope or range of equivalents of the following claims.

What is claimed is:

1. A method of enhancement in telemetry communications from a Measurements While Drilling or Logging While Drilling ("MLWD") downhole transmitting tool in a hydrocarbon wellbore to a receiving station, comprising:
    aggregating sets of data of downhole measurements into a plurality of measurement blocks, each measurement block having a set of data for a time interval;
    transmitting in telemetry the measurement blocks from the MLWD downhole transmitting tool to the receiving station independently of a telemetry signal quality at the receiving station;
    evaluating the sets of data for a gap of data;
    filling at least a portion of the gap of data with data of downhole measurements corresponding to the time interval of the gap of data: and
    creating a measurement data stream of data from the measurement blocks with at least the portion of the gap of data filled.

2. The method of claim 1, further comprising determining a cause of the gap of data, and based on the cause, selecting a type of measurement block to extract data therefrom to at least partially fill the gap.

3. The method of claim 1,
    wherein aggregating sets of data of downhole measurements further comprises aggregating at least one set of data with a special set of data corresponding to at least a portion of a time interval that overlaps with a special sequence being sent in telemetry to the receiving station and a next set of data corresponding to a next time interval to the special set of data to create a combined measurement block; and
    further comprising
        using the combined measurement block of data to at least partially fill the gap and supply the next set of data for the measurement data stream.

4. The method of claim 3, wherein the special sequence comprises a Stationary Survey sequence.

5. The method of claim 3, wherein the special sequence comprises an interrupting sequence.

6. The method of claim 3, wherein the special sequence being sent in telemetry comprises the special sequence being sent in telemetry in place of a sequence containing the measurement block of at least a time during the special sequence being sent.

7. The method of claim 1,
    wherein aggregating sets of data of downhole measurements further comprises aggregating overlapping sets of data based on overlapping time intervals to create one or more adjacent overlapping measurement blocks; and
    further comprising
        discarding any corrupted data for a corresponding time interval, and
        filling at least partially the gap with data from at least one of the adjacent overlapping measurement blocks corresponding to the time interval of the corrupted data.

8. The method of claim 1,
wherein aggregating sets of data of downhole measurements further comprises aggregating at least one set of data in an event measurement block in a sequence set of a plurality of measurement blocks with a sampling rate that is different than a predetermined sampling rate of a set of data in another measurement block in the sequence set; and
further comprising
filling at least partially the gap with data from the at least one set of data in the event measurement block with the sampling rate that is different than the predetermined sampling rate.

9. The method of claim 8, wherein the gap event comprises a rate of change of measurement values that is different than a predetermined rate of change of the measurement values.

10. The method of claim 9, wherein the predetermined rate of change comprises an acceptable range of the rate of change.

11. The method of claim 8, wherein the sampling rate in the event measurement block is greater than the predetermined sampling rate.

12. The method of claim 1, wherein providing data from one or more of the measurement blocks to fill the gap to populate the data stream for the time period occurs in real time.

13. The method of claim 1, wherein aggregating sets of data of downhole measurements into the plurality of measurement blocks comprises compressing data samples for a corresponding time interval.

14. The method of claim 13, wherein compressing data samples for the corresponding time interval comprises compressing with lossy compression.

15. The method of claim 13, wherein compressing data samples for the corresponding time interval comprises compressing with lossless compression.

16. A system for telemetry enhancement, the system having at least a Measurements While Drilling or Logging While Drilling ("MLWD") downhole transmitting tool for sending measurement data in telemetry, a receiving station to receive the measurement data, a data processing system in communication with the receiving station, and a communication path for sending the measurement data from the transmitting tool to the receiving station, the system configured to:
aggregate sets of data of downhole measurements into a plurality of measurement blocks, each measurement block having a set of data for a time interval;
transmit in telemetry the measurement blocks from the MLWD downhole transmitting tool to the receiving station independently of a telemetry signal quality at the receiving station;
evaluate the sets of data for a gap of data;
fill at least a portion of the gap of data with data of downhole measurements corresponding to the time interval of the gap of data: and
create a measurement data stream of data from the measurement blocks with at least the portion of the gap of data filled.

17. The system of claim 16, further comprising the system configured to determine a cause of the gap of data, and based on the cause, select a type of measurement block to extract data therefrom to at least partially fill the gap.

18. The system of claim 16,
wherein the system being configured to aggregate sets of data of downhole measurements further comprises the system configured to aggregate at least one set of data with a special set of data corresponding to at least a portion of a time interval that overlaps with a special sequence being sent in telemetry to the receiving station and a next set of data corresponding to a next time interval to the special set of data to create a combined measurement block; and
further comprising the system configured to:
determine a cause of the gap of data, and if the cause is by a special sequence sent in telemetry, then
use the combined measurement block of data to at least partially fill the gap and supply the next set of data for the measurement data stream.

19. The system of claim 18, wherein the special sequence comprises a Stationary Survey sequence.

20. The system of claim 18, wherein the special sequence comprises an interrupting sequence.

21. The system of claim 18, wherein the special sequence sent in telemetry comprises the special sequence sent in telemetry at a time interval for a measurement block.

22. The system of claim 16,
wherein the system being configured to aggregate sets of data of downhole measurements further comprises the system configured to aggregate overlapping sets of data based on overlapping time intervals to create one or more adjacent overlapping measurement blocks; and
further comprising the system configured to:
determine a cause of the gap of data, and if the cause is by corrupted data in a set of data, then
discard the corrupted data for a corresponding time interval, and
fill at least partially the gap with data from at least one of the adjacent overlapping measurement blocks corresponding to the time interval of the corrupted data.

23. The system of claim 16,
wherein the system being configured to aggregate sets of data of downhole measurements further comprises the system configured to aggregate at least one set of data in an event measurement block with a sampling rate that is different than a predetermined sampling rate of an adjacent set of data; and
further comprising the system configured to:
determine a cause of the gap of data, and if the cause is by a gap event, then
fill at least partially the gap with data from the at least one set of data with the sampling rate that is different than the predetermined sampling rate for the event measurement block.

24. The system of claim 23, wherein the gap event comprises a rate of change of measurement values that is different than a predetermined rate of change of the measurement values.

25. The system of claim 24, wherein the predetermined rate of change comprises an acceptable range of the rate of change.

26. The system of claim 23, wherein the sampling rate in the event measurement block is greater than the predetermined sampling rate.

27. The system of claim 16, wherein the sets of data comprises compressed data.

28. The system of claim 27, wherein the compressed data is formed with lossy compression.

29. The system of claim 27, wherein the compressed data is formed with lossless compression.

30. A system for telemetry enhancement, the system having at least a Measurements While Drilling or Logging While Drilling ("MLWD") downhole transmitting tool for sending measurement data in telemetry, a receiving station to receive the measurement data, a data processing system in communication with the receiving station, and a communication path for sending the measurement data from the transmitting tool to the receiving station, the system configured to:

aggregate sets of data of downhole measurements into a plurality of measurement blocks, each measurement block having a set of data for a time interval with additional data of another time interval;

transmit in telemetry the measurement blocks with the additional data from the MLWD downhole transmitting tool to the receiving station independently of a telemetry signal quality at the receiving station;

evaluate the sets of data for a gap of data;

fill at least a portion of the gap of data with the additional data of downhole measurements corresponding to the time interval of the gap of data: and create a measurement data stream of data from the measurement blocks with at least the portion of the gap of data filled.

\* \* \* \* \*